(12) United States Patent
Richter et al.

(10) Patent No.: US 12,136,738 B2
(45) Date of Patent: Nov. 5, 2024

(54) REGENERATIVE ELECTRICAL POWER SYSTEM WITH STATE OF CHARGE MANAGEMENT IN VIEW OF PREDICTED AND/OR SCHEDULED STOPOVER AUXILIARY POWER REQUIREMENTS

(71) Applicant: Hyliion Inc., Cedar Park, TX (US)

(72) Inventors: Roger Richter, Leander, TX (US); Morgan Culbertson, Shadyside, PA (US)

(73) Assignee: Hyliion Inc., Cedar Park, TX (US)

( * ) Notice: Subject to any disclaimer, the term of this patent is extended or adjusted under 35 U.S.C. 154(b) by 0 days.

(21) Appl. No.: 18/522,940

(22) Filed: Nov. 29, 2023

(65) Prior Publication Data
US 2024/0097253 A1 Mar. 21, 2024

Related U.S. Application Data

(63) Continuation of application No. 17/990,168, filed on Nov. 18, 2022, now Pat. No. 11,876,236, which is a
(Continued)

(51) Int. Cl.
*H01M 50/20* (2021.01)
*B60K 6/28* (2007.10)
(Continued)

(52) U.S. Cl.
CPC ............ *H01M 50/20* (2021.01); *B60K 6/28* (2013.01); *B60L 50/60* (2019.02); *B60L 50/64* (2019.02);
(Continued)

(58) Field of Classification Search
CPC ...... H01M 10/46; H01M 10/48; H01M 50/20; G01R 31/382; G01R 31/3842; B60L 7/10;
(Continued)

(56) References Cited

U.S. PATENT DOCUMENTS

| 4,199,037 A | 4/1980 | White |
| 5,488,352 A | 1/1996 | Jasper |

(Continued)

FOREIGN PATENT DOCUMENTS

| CA | 2457216 A1 | 8/2004 |
| WO | 2005012025 A1 | 2/2005 |

(Continued)

OTHER PUBLICATIONS

Zulkifli, S.A.: "Split-Parallel Through-the-Road Hybrid Electric Vehicle: Operation, Power Flow and Control Modes", 2015 IEEE Transportation Electrification Conference and Expo (ITEC), Jun. 17, 2015 (Jun. 17, 2015), p. 107. 7 pages.
(Continued)

*Primary Examiner* — Jeffrey J Restifo
(74) *Attorney, Agent, or Firm* — Baker Botts L.L.P.

(57) ABSTRACT

A method for managing a state of charge (SOC) of an energy store of a vehicle comprising storing an encoding of a dynamic weight value, computationally determining an estimated travel time to a stopover location, using the estimated travel time to modify the dynamic weight value to provide
(Continued)

an updated dynamic weight value, and responsive to providing the updated dynamic weight value, increasing the SOC of the energy store while the vehicle travels over a roadway to provide a target SoC of the energy store when the vehicle arrives at the stopover location.

16 Claims, 9 Drawing Sheets

Related U.S. Application Data continuation of application No. 17/401,832, filed on Aug. 13, 2021, now Pat. No. 11,527,799, which is a continuation of application No. 16/237,504, filed on Dec. 31, 2018, now Pat. No. 11,094,988.

(60) Provisional application No. 62/612,559, filed on Dec. 31, 2017.

(51) Int. Cl.
| | |
|---|---|
| *B60L 50/60* | (2019.01) |
| *B60L 50/64* | (2019.01) |
| *G01C 21/34* | (2006.01) |
| *G01R 31/382* | (2019.01) |
| *G01S 19/31* | (2010.01) |
| *H01M 10/44* | (2006.01) |
| *H01M 10/46* | (2006.01) |
| *H01M 50/249* | (2021.01) |

(52) U.S. Cl.
CPC ....... *G01C 21/3407* (2013.01); *G01R 31/382* (2019.01); *G01S 19/31* (2013.01); *H01M 10/44* (2013.01); *H01M 10/46* (2013.01); *H01M 50/249* (2021.01)

(58) Field of Classification Search
CPC ...... B60L 7/12; B60L 7/14; B60L 7/16; B60L 7/20; B60L 7/24; B60W 30/18127
See application file for complete search history.

(56) References Cited

U.S. PATENT DOCUMENTS

| | | | |
|---|---|---|---|
| 5,559,420 A | 9/1996 | Kohchi | |
| 6,390,215 B1 | 5/2002 | Kodama | |
| 6,516,925 B1 | 11/2003 | Napier | |
| 7,147,070 B2 | 12/2006 | Leclerc | |
| 7,338,335 B1 | 3/2008 | Messano | |
| 7,665,557 B2 | 2/2010 | Hughes | |
| 8,229,615 B2 | 7/2012 | Sakamoto | |
| 8,327,960 B2 | 12/2012 | Couture | |
| 8,627,908 B2 | 1/2014 | Wellborn | |
| 8,755,961 B2 | 6/2014 | Yamada | |
| 8,942,919 B2 | 1/2015 | Uyeki | |
| 9,162,671 B2 | 10/2015 | Itoh | |
| 9,321,357 B2 | 4/2016 | Caldeira | |
| 9,434,378 B2 | 9/2016 | Geller | |
| 9,457,666 B2 | 10/2016 | Caldeira | |
| 9,499,157 B2 | 11/2016 | Muller | |
| 9,517,705 B1* | 12/2016 | Liu ..................... B60L 15/2045 |
| 9,809,182 B2* | 11/2017 | Brunbauer ............. B60R 16/03 |
| 9,887,570 B2* | 2/2018 | Johnsen ................ B60L 53/14 |
| 9,937,819 B2* | 4/2018 | Healy ..................... B62D 59/04 |
| 9,948,136 B2* | 4/2018 | Doane .................. H02J 7/1438 |
| 10,245,972 B2* | 4/2019 | Healy ..................... B60L 8/003 |
| 10,407,081 B2* | 9/2019 | Ichikawa ............. B60W 20/00 |
| 10,449,954 B2* | 10/2019 | Layfield ................ B60L 15/32 |
| 10,500,975 B1* | 12/2019 | Healy ..................... B60K 6/48 |
| 10,596,913 B2* | 3/2020 | Healy ................. B60L 15/2018 |
| 10,737,684 B2* | 8/2020 | Schlumpp ............. B60W 20/13 |
| 10,766,478 B2* | 9/2020 | Healy ............. B60W 30/18127 |
| 10,821,853 B2* | 11/2020 | Healy ................... B60W 20/12 |
| 10,906,406 B1* | 2/2021 | Healy ..................... B60K 6/48 |
| 11,332,038 B1* | 5/2022 | Wang ..................... B60L 50/60 |
| 2002/0038730 A1 | 4/2002 | Bidwell | |
| 2002/0056579 A1 | 5/2002 | Cooper | |
| 2004/0002794 A1 | 1/2004 | Pillar | |
| 2005/0045058 A1 | 3/2005 | Donnelly | |
| 2005/0060079 A1 | 3/2005 | Phillips | |
| 2007/0193795 A1 | 8/2007 | Forsyth | |
| 2008/0169144 A1 | 7/2008 | DeGrave | |
| 2008/0174174 A1 | 7/2008 | Burns | |
| 2009/0223725 A1 | 9/2009 | Rodriguez | |
| 2010/0019726 A1* | 1/2010 | Kumar .................... B60L 58/14 320/136 |
| 2010/0065344 A1 | 3/2010 | Collings | |
| 2010/0141201 A1 | 6/2010 | Littrell | |
| 2010/0224430 A1 | 9/2010 | Bennett, Sr. | |
| 2010/0252339 A1 | 10/2010 | Bibeau | |
| 2010/0282122 A1 | 11/2010 | Mai | |
| 2011/0042154 A1 | 2/2011 | Bartel | |
| 2011/0094807 A1 | 4/2011 | Pruitt | |
| 2011/0320078 A1 | 12/2011 | McGill | |
| 2012/0041623 A1* | 2/2012 | Hermann ................ B60L 53/65 320/137 |
| 2012/0167555 A1 | 7/2012 | Frazier | |
| 2013/0190998 A1 | 7/2013 | Polimeno | |
| 2013/0204501 A1 | 8/2013 | Keeney | |
| 2013/0338848 A1 | 12/2013 | Park | |
| 2014/0025245 A1 | 1/2014 | Fanourakis | |
| 2014/0116077 A1 | 5/2014 | Pierce et al. | |
| 2014/0210638 A1* | 7/2014 | Gussen .................... B60L 58/14 340/870.09 |
| 2014/0277931 A1* | 9/2014 | Crowe .................... B60L 58/31 701/36 |
| 2015/0151638 A1* | 6/2015 | Tagawa ............... B60L 15/2009 180/65.265 |
| 2015/0204741 A1 | 10/2015 | Hagan | |
| 2015/0298680 A1 | 10/2015 | Matthews | |
| 2015/0298684 A1 | 10/2015 | Schwartz | |
| 2016/0014252 A1 | 1/2016 | Biderman | |
| 2016/0031435 A1 | 2/2016 | Gibson | |
| 2016/0061611 A1 | 3/2016 | Meyer | |
| 2016/0137204 A1 | 5/2016 | Morselli | |
| 2016/0243947 A1* | 8/2016 | Perkins ................... B60L 53/14 |
| 2016/0243958 A1* | 8/2016 | Miller ..................... B60L 53/14 |
| 2016/0318421 A1 | 11/2016 | Healy | |
| 2016/0375782 A1* | 12/2016 | Liu ......................... B60L 58/12 320/109 |
| 2016/0375785 A1* | 12/2016 | Liu ......................... B60L 15/20 701/22 |
| 2016/0375786 A1* | 12/2016 | Liu ....................... B60W 10/08 701/22 |
| 2016/0375787 A1* | 12/2016 | Liu ......................... B60L 58/12 701/22 |
| 2017/0096134 A1* | 4/2017 | Yoon ..................... B60W 20/13 |
| 2017/0151891 A1* | 6/2017 | Igarashi ............... B60L 15/2018 |
| 2018/0086227 A1* | 3/2018 | Healy ................... B60L 15/2018 |
| 2018/0093655 A1* | 4/2018 | Healy ..................... B60L 1/003 |
| 2018/0236994 A1* | 8/2018 | Healy ..................... B60K 6/22 |
| 2019/0077273 A1* | 3/2019 | Jang ........................ B60L 58/20 |
| 2019/0193579 A1* | 6/2019 | Katanoda ................ B60L 50/60 |
| 2019/0202312 A1* | 7/2019 | Aufdencamp ........... B60K 6/52 |
| 2019/0207180 A1* | 7/2019 | Richter ................ B60W 10/08 |
| 2019/0291593 A1* | 9/2019 | Healy ................. B60L 15/2009 |
| 2019/0322270 A1* | 10/2019 | Kurihashi ............ G05D 1/0217 |
| 2020/0070679 A1* | 3/2020 | Wang ..................... B60L 58/21 |
| 2020/0164763 A1* | 5/2020 | Holme ................... B60L 58/16 |
| 2020/0215921 A1* | 7/2020 | Healy ................. B60L 15/2045 |
| 2020/0376966 A1* | 12/2020 | Healy ..................... B60L 7/10 |
| 2020/0398657 A1* | 12/2020 | Healy ................... B60W 10/18 |
| 2021/0016678 A1* | 1/2021 | Healy ..................... B60L 50/40 |
| 2021/0046845 A1* | 2/2021 | Healy ..................... B60L 58/13 |
| 2021/0065073 A1* | 3/2021 | Maeda ................... H04L 67/52 |
| 2021/0151809 A1* | 5/2021 | Kong ................... G01R 31/3835 |
| 2021/0213948 A1* | 7/2021 | Lahti ................... B60W 30/162 |
| 2021/0242510 A1* | 8/2021 | Li ........................... B60L 58/12 |
| 2022/0041069 A1* | 2/2022 | Layfield ................. B60L 7/10 |
| 2022/0077481 A1* | 3/2022 | Igarashi ............... H01M 8/04955 |
| 2022/0097676 A1* | 3/2022 | Gesang ................. B60W 20/14 |

(56) References Cited

U.S. PATENT DOCUMENTS

| | | | |
|---|---|---|---|
| 2022/0153138 A1* | 5/2022 | Dalum | B60K 25/06 |
| 2022/0176939 A1* | 6/2022 | Poll | B60W 10/26 |
| 2022/0219669 A1* | 7/2022 | Shiraiwa | B60W 30/182 |
| 2022/0289039 A1* | 9/2022 | Boaretto | B60K 6/48 |
| 2022/0306074 A1* | 9/2022 | Kono | B60W 10/06 |
| 2023/0059385 A1* | 2/2023 | Healy | B60W 20/10 |
| 2023/0098099 A1* | 3/2023 | Kumar | G01R 31/382 |
| | | | 701/36 |

FOREIGN PATENT DOCUMENTS

| | | |
|---|---|---|
| WO | 2015052567 A1 | 4/2015 |
| WO | 2018064619 A2 | 4/2018 |

OTHER PUBLICATIONS

PCT International Search Report, Application No. PCT/US2017/054587, Apr. 20, 2018. 6 pages.

PCT International Search Report, Application No. PCT/US2018/018499, May 22, 2018. 4 pages.

European Search Report, Application No. 16789915.2, Jan. 8, 2018. 7 pages.

Karbowski, Sokolov, and Rousseau, "Vehicle Energy Management Optimisation through Digital Maps and Connectivity", 22nd ITS World Congress, ITS-1952, Bordeaux, France, Oct. 5-9, 2015. 9 pages.

Lin, Kang, Grizzle, and Peng, "Energy Management Strategy for a Parallel Hybrid Electric Truck", Proceedings of the American Control Conference, 2001, pp. 2878-2883, Digital Object Identifier: 10.1109/ACC.2001.946337. 7 pages.

Zulkifli, Mohd, Saad, and Aziz, "Operation and Control of Split-Parallel, Through-The-Road Hybrid Electric Vehicle With In-Wheel Motors", International Journal of Automotive and Mechanical Engineering, vol. 11, pp. 2793-2808, 2015, Digital Object Identifier: 10.15282/ijame. 11.2015.54.0235. 2015. 16 pages.

Kural and Guvenc, "Predictive-Equivalent Consumption Minimization Strategy for Energy Management of a Parallel Hybrid Vehicle for Optimal Recuperation", Journal of Polytechnic, 18(3), pp. 113-124, 2015, Digital Object Identifier: 10.2339/2015.18.3, 113-124. 12 pages.

Skugor, Pavkovic, and Deur, "A Series-Parallel Hybrid Electric Vehicle Control Strategy Including Instantaneous Optimization of Equivalent Fuel Consumption", IEEE International Conference on Control Applications, pp. 310-316, 2012. 7 pages.

PCT International Search Report and Written Opinion, Application No. PCT/US2016/030482, Aug. 4, 2016. 2 pages.

Musardo, Rizzoni, and Staccia, "A-ECMS: An Adaptive Algorithm for Hybrid Electric Vehicle Energy Management", Proceedings of the 44th IEEE Conference on Decision and Control, 2005, pp. 1816-1823. 8 pages.

Paganelli, Delprat, Guerra, Rimaux, and Santin, "Equivalent Consumption Minimization Strategy for Parallel Hybrid Powertrains", Proceedings of the IEEE 55th Vehicular Technology Conference, 2002, pp. 2076-2081. 6 pages.

Sciarretta, Back, and Guzzella, "Optimal Control of Parallel Hybrid Electric Vehicles", IEEE Transactions on Control Systems Technology, vol. 12, No. 3, pp. 352-363, May 2004. 12 pages.

Sciarretta and Guzzella, "Control of Hybrid Electric Vehicles", IEEE Control Systems Magazine, vol. 27, No. 2, pp. 60-70, Apr. 2007. 10 pages.

* cited by examiner

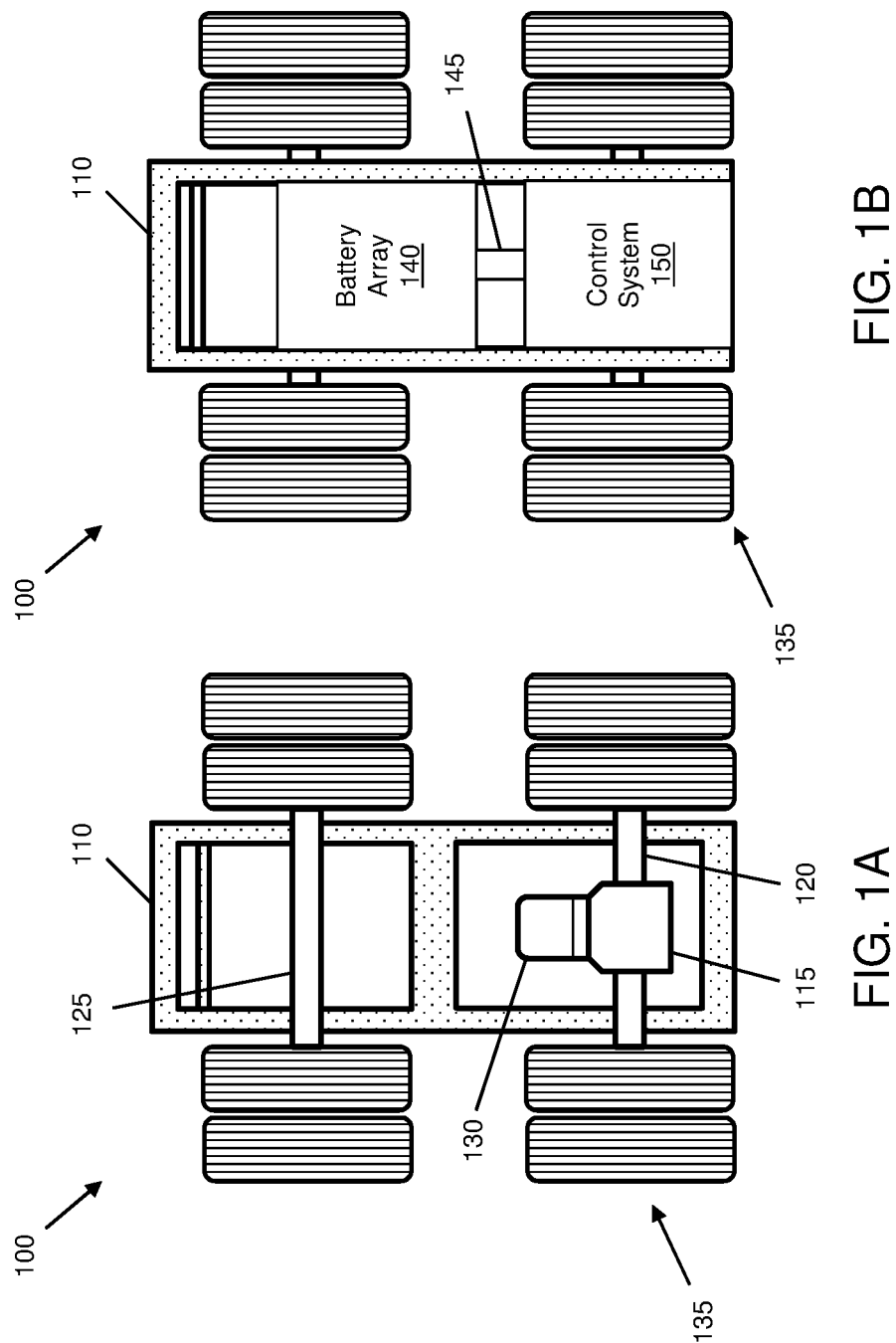

REGENERATIVE ELECTRICAL POWER SYSTEM WITH STATE OF CHARGE MANAGEMENT IN VIEW OF PREDICTED AND/OR SCHEDULED STOPOVER AUXILIARY POWER REQUIREMENTS

BENEFIT CLAIM

This application claims the benefit under 35 U.S.C. § 120 as a continuation of application Ser. No. 17/990,168, filed Nov. 18, 2022, which claims the benefit of application Ser. No. 17/401,832, filed Aug. 13, 2021, which claims the benefit of application Ser. No. 16/237,504, filed Dec. 31, 2018, which claims the benefit of application 62/612,559, filed Dec. 31, 2017, and is related to application Ser. No. 15/721,345, filed Sep. 29, 2017, now U.S. Pat. No. 10,821,853, and the entire contents of all the foregoing are hereby incorporated by reference for all purposes as if fully set forth herein. The applicant hereby rescinds any disclaimer of subject matter occurring in any of the foregoing applications and advises the PTO that the claims of this application may be broader than in any of the foregoing applications.

BACKGROUND

Field of the Invention

The invention relates generally to hybrid vehicle technology, and in particular to systems and methods to intelligently control regeneration and reuse of captured energy in a through-the-road (TTR) hybrid configuration.

Description of the Related Art

The U.S. trucking industry consumes about 51 billion gallons of fuel per year, accounting for over 30% of overall industry operating costs. In addition, the trucking industry spends over $100 billion on fuel annually, and the average fuel economy of a tractor-trailer (e.g., an 18-wheeler) is only about 6.5 miles per gallon. For trucking fleets faced with large fuel costs, techniques for reducing those costs would be worth considering.

Hybrid technology has been in development for use in the trucking industry for some time, and some hybrid trucks have entered the market. However, existing systems are generally focused on hybridizing the drivetrain of a heavy truck or tractor unit, while any attached trailer or dead axles remain a passive load. Thus, the extent to which the fuel efficiency of a trucking fleet may be improved using these technologies may be limited to the fuel efficiencies obtained from improvement of the hybrid drivetrain and the in-fleet adoption of such hybrid drivetrain technologies. Given the large numbers of heavy trucks and tractor units already in service and their useful service lifetimes (often 10-20 years), the improved hybrid drivetrains that are candidates for introduction in new vehicles would only address a small fraction of existing fleets.

Apart from fuel used to provide motive force to a heavy truck or tractor unit, fuel may also be used while idling the vehicle during a stopover to provide power to operate accessory equipment such as heating and air conditioning systems for sleeper cabs or to power other types of accessory equipment. As an alternative to idling a vehicle, auxiliary power units (APUs) have been introduced. For example, an APU for a heavy truck or tractor unit may include a diesel engine with its own cooling system, heating system, generator or alternator system with or without inverter, and air conditioning compressor, housed in an enclosure and mounted to one of the frame rails of the heavy truck or tractor unit. While diesel-powered APUs may consume less fuel, for example as compared to fuel consumed by idling a heavy truck or tractor unit, diesel-powered APUs nevertheless consume fuel, require maintenance, and can be quite costly.

Thus, improved techniques, increased adoption, and new functional capabilities are all desired.

SUMMARY

It has been discovered that a through-the-road (TTR) hybridization strategy can facilitate introduction of hybrid electric vehicle technology in a significant portion of current and expected trucking fleets. In some cases, the technologies can be retrofitted onto an existing vehicle (e.g., a truck, a tractor unit, a trailer, a tractor-trailer configuration, at a tandem, etc.). In some cases, the technologies can be built into new vehicles. In some cases, one vehicle may be built or retrofitted to operate in tandem with another and provide the hybridization benefits contemplated herein. By supplementing motive forces delivered through a primary drivetrain and fuel-fed engine with supplemental torque delivered at one or more electrically-powered drive axles, improvements in overall fuel efficiency and performance may be delivered, typically without significant redesign of existing components and systems that have been proven in the trucking industry.

In addition, embodiments disclosed provide for the recapture and use of energy not only to provide supplemental motive forces, but also to provide an electric auxiliary power unit (APU) that may be used for powering a host of devices and/or systems, both on a trailer or a tractor unit towing the trailer, without having to idle a vehicle. For example, in various embodiments, the APU may be used to power a lift gate, a refrigeration unit, a heating ventilation and air conditioning (HVAC) system, pumps, lighting, appliances, entertainment devices, communications systems, or other electrically powered devices during a stopover.

As such, embodiments of the present disclosure provide for the use of predicted or estimated stopover information to manage a battery state of charge (SOC) so as to provide sufficient power for APU operation at stopover. In some embodiments, stopover may be predicted based on legally mandated rest and/or based on available stopover sites along a preplanned route schedule, driver preferences, history or other factors. In general, the system alters its ordinary SOC management strategy to control the consumption and/or generation or regeneration of electrical power and to top off batteries in anticipation of a predicted stopover.

In some embodiments of the present invention, a vehicle includes an electrically powered drive axle configured to supply supplemental torque to one or more wheels of the vehicle and to thereby supplement, while the vehicle travels over a roadway and in at least some modes of operation, primary motive forces applied through a separate drivetrain powered by a fuel-fed engine of the vehicle. The vehicle further includes an energy store configured to supply the electrically powered drive axle with electrical power in a first mode of operation and further configured to receive energy recovered using the electrically powered drive axle in a second mode of operation. In some examples, the vehicle also includes an auxiliary power unit (APU) on the vehicle, the auxiliary power unit coupled to receive electrical power from the energy store, where for stopover operation and without idling of the fuel-fed engine, the energy store powers the auxiliary power unit. The vehicle further includes a hybrid control system for controllably managing, based at least partly on an estimated travel time to a stopover location, a state of charge (SoC) of the energy store while the vehicle travels over the roadway to provide a desired SoC of the energy store when the vehicle arrives at the stopover location.

In some embodiments, the hybrid control system maintains a machine-readable encoding of a dynamic weight value that specifies usage of the fuel-fed engine that powers the separate drivetrain, relative to usage of the energy store that powers the electrically powered drive axle, and the hybrid control system controllably manages the SoC of the energy store by controllably managing the dynamic weight value.

In some embodiments, the hybrid control system determines the dynamic weight value using the estimated travel time to the stopover location.

In some embodiments, as the estimated time to the stopover location decreases, the hybrid control system increases the dynamic weight value.

In some embodiments, the estimated travel time to the stopover location includes one of (i) a first estimated travel time to a mandatory rest period, (ii) a second estimated travel time to a prior stopover location, and (iii) a third estimated travel time to a designated stopover location pre-assigned by a fleet manager or a vehicle operator. In various cases, the hybrid control system controllably manages the SoC of the energy store by controllably managing a dynamic weight value that specifies usage of the fuel-fed engine relative to usage of the energy store, and the hybrid control system determines the dynamic weight value using the estimated travel time to the stopover location.

In some embodiments, as the vehicle travels over the roadway, and based on a vehicle operator continuous driving time and on a vehicle operator driving time limit, the hybrid control system is used to computationally determine an estimated travel time to a mandatory rest period, and based on the estimated travel time to the mandatory rest period, the hybrid control system is used to update the dynamic weight value.

In some embodiments, the hybrid control system includes a machine-readable encoding of a list of global positioning system (GPS) coordinates of a plurality of prior stopover locations. In some cases, the hybrid control system computationally determines, based on a current GPS location of the vehicle and on the list of GPS coordinates of the plurality of prior stopover locations, an estimated travel time between the current GPS location of the vehicle and each of the plurality of prior stopover locations. In some embodiments, as the vehicle travels over the roadway, and based on the estimated travel time to a closest one of the plurality of prior stopover locations, the hybrid control system is used to update the dynamic weight value.

In some embodiments, the hybrid control system computationally determines, based on the current GPS location of the vehicle and on a filtered list of GPS coordinates of the plurality of prior stopover locations that includes prior stopover locations along a projected route of the vehicle, an estimated travel time between the current GPS location of the vehicle and each of the stopover locations along the projected route of the vehicle.

In some embodiments, the hybrid control system includes a machine-readable encoding of global positioning system (GPS) coordinates of a designated stopover location pre-assigned by a fleet manager or a vehicle operator. In some examples, the hybrid control system computationally determines, based on a current GPS location of the vehicle and on the GPS coordinates of the designated stopover location, an estimated travel time between the current GPS location of the vehicle and the designated stopover location. In some embodiments, as the vehicle travels over the roadway, and based on the estimated travel time the designated stopover location, the hybrid control system is used to update the dynamic weight value.

In some embodiments, the vehicle further includes a vehicle navigation system coupled to the hybrid control system, where the vehicle navigation system provides the estimated travel time to the stopover location based in part on real-time traffic data. In some examples, the hybrid control system controllably manages the SoC of the energy store by controllably managing a dynamic weight value that specifies usage of the fuel-fed engine relative to usage of the energy store. In some embodiments, the hybrid control system updates the dynamic weight value in accordance with changes in the estimated travel time resulting from changes in the real-time traffic data.

In some embodiments, the vehicle further includes a user device including an operator interface, where a vehicle operator manually initiates, via the operator interface, an increase in the SoC of the energy store by the hybrid control system.

In some embodiments, the user device includes an electronic logging device (ELD).

In some embodiments, the hybrid control system computationally determines a target SoC of the energy store for operating the vehicle in an APU mode, computationally determines a difference between the target SoC and a current SoC of the energy store, computationally determines a time to charge the energy store to the target SoC, and manages charging of the energy store over the computationally determined time.

In some embodiments, the vehicle includes a towed vehicle, a towing vehicle, or a combination thereof.

In some embodiments of the present invention, a method for managing a state of charge (SoC) of an energy store of a vehicle includes storing a machine-readable encoding of a dynamic weight value that specifies usage of a fuel-fed engine relative to usage of the energy store. The fuel-fed engine powers a drivetrain that provides primary motive forces to the vehicle. The energy store is configured to supply electrical power to an electrically powered drive axle that provides supplemental torque to one or more wheels of the vehicle in a first mode of operation, and the energy store is configured to receive energy recovered using the electrically powered drive axle in a second mode of operation. In some embodiments, an estimated travel time to a stopover location is computationally determined based in part on a distance between a current GPS location of the vehicle and the stopover location. In some examples, using the estimated travel time, the dynamic weight value is modified to provide an updated dynamic weight value. In some embodiments, and responsive to providing the updated dynamic weight value, the SoC of the energy store is increased while the vehicle travels over a roadway to provide a target SoC of the energy store when the vehicle arrives at the stopover location.

In some embodiments, the method further includes while at the stopover location and without idling of the fuel-fed engine, operating an auxiliary power unit (APU) on the vehicle, the auxiliary power unit coupled to receive electrical power from the energy store.

In some embodiments, the computationally determining the estimated travel time further includes computationally determining at least one of (i) a first estimated travel time to a mandatory rest period, (ii) a second estimated travel time to a prior stopover location, and (iii) a third estimated travel time to a designated stopover location pre-assigned by a fleet manager or a vehicle operator.

In some embodiments, the method further includes prior to computationally determining the estimated travel time to the stopover location, determining that the stopover location is along a projected route of the vehicle.

In some embodiments, the method further includes computationally determining the target SoC of the energy store for operating the vehicle in an APU mode, computationally determining a difference between the target SoC and a current SoC of the energy store, computationally determining a time to charge the energy store to the target SoC, and managing charging of the energy store over the computationally determined time.

In some embodiments, the vehicle includes a towed vehicle, a towing vehicle, or a combination thereof.

BRIEF DESCRIPTION OF THE DRAWINGS

The present invention is illustrated by way of example and not limitation with reference to the accompanying figures, in which like references generally indicate similar elements or features.

FIG. 1A depicts a bottom view of a hybrid suspension system, in accordance with some embodiments;

FIG. 1B depicts a top view of the hybrid suspension system, in accordance with some embodiments;

Figure 1C:
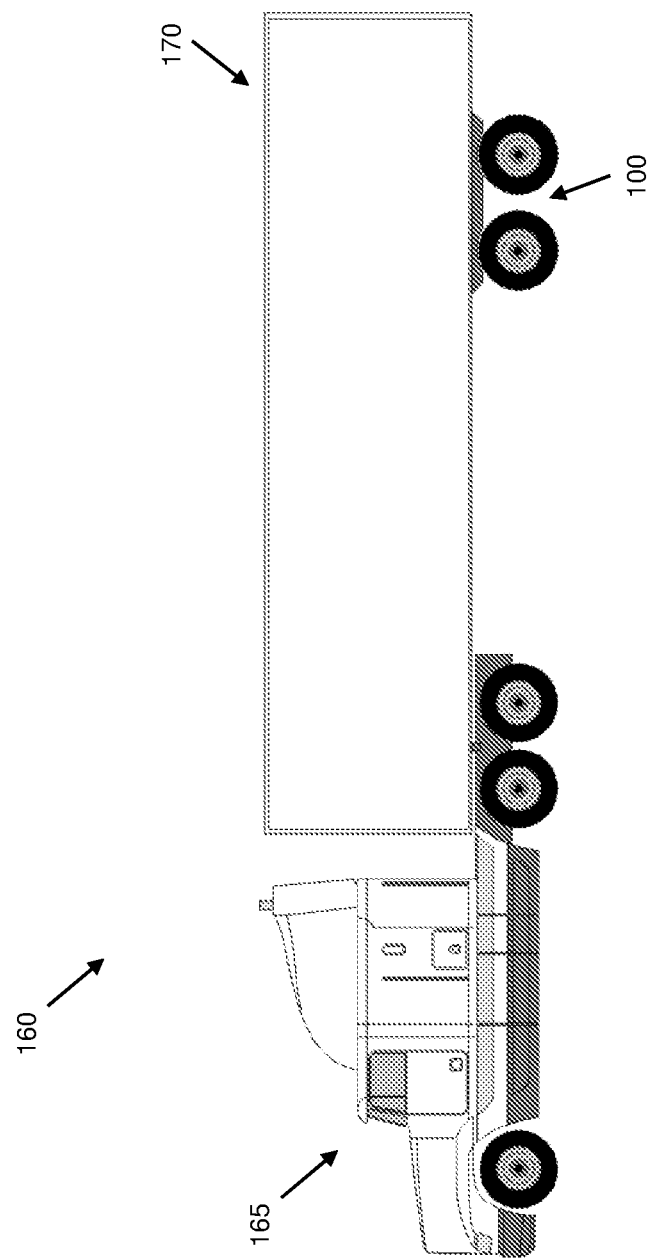
FIG. 1C depicts an exemplary tractor-trailer vehicle, including the hybrid suspension system, in accordance with some embodiments.

Skilled artisans will appreciate that elements or features in the figures are illustrated for simplicity and clarity and have not necessarily been drawn to scale. For example, the dimensions or prominence of some of the illustrated elements or features may be exaggerated relative to other elements or features in an effort to help to improve understanding of certain embodiments of the present invention(s).

DESCRIPTION

The present application describes a variety of embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In particular, the present disclosure describes designs and techniques for providing an energy management system and related methods in the context of systems and components typical in the heavy trucking industry. Some embodiments of the present invention(s) provide a hybridized suspension assembly (e.g., an electrically driven axle, power source, controller, etc. that may be integrated with suspension components) affixed (or suitable for affixing) underneath a vehicle (e.g., a truck, a tractor unit, trailer, tractor-trailer or tandem configuration, etc.) as a replacement to a passive suspension assembly. In various non-limiting example configurations, a hybridized suspension assembly can be part of a trailer that may be towed by a powered vehicle, such as a fuel-consuming tractor unit.

As described in more detail below, a hybridized suspension assembly is but one realization in which an electrically driven axle operates largely independently of the fuel-fed engine and primary drivetrain of a powered vehicle and is configured to operate in a power assist, regeneration, and passive modes to supplement motive/braking forces and torques applied by the primary drivetrain and/or in braking. In general, one or more electrically driven axles may supplement motive/braking forces and torques under control of a controller (or controllers) that does not itself (or do not themselves) control the fuel-fed engine and primary drivetrain. Instead, a control strategy implemented by an electric drive controller seeks to follow and supplement the motive inputs of the fuel-fed engine and primary drivetrain using operating parameters that are observable (e.g., via CANbus or SAE J1939 type interfaces), kinematics that are sensed and/or states that may be computationally estimated based on either or both of the foregoing. In some embodiments, based on such observed, sensed or estimated parameters or states, the electric drive controller applies an equivalent consumption minimization strategy (ECMS) or adaptive ECMS type control strategy to modulate the motive force or torque provided, at the electrically driven axle(s), as a supplement to that independently applied using the fuel-fed engine and primary drivetrain of the powered vehicle.

By supplementing the fuel-fed engine and primary drivetrain of the powered vehicle, some embodiments of the present invention(s) seek to simultaneously optimize fuel consumption of the powered vehicle, energy consumption of the hybrid suspension assembly, and/or state of charge (SOC) of on-board batteries or other energy stores. In some cases, such as during stopovers, embodiments of the present disclosure allow the fuel-fed engine to shut down rather than idle. In some cases, energy consumption management strategies may take into account a desired SOC at scheduled, mandated or predicted stopovers. Among other advantages, embodiments disclosed herein provide for a significant reduction in fuel consumption (e.g., an average of about 30%), a built-in auxiliary power unit (APU), enhanced stability control, improved trailer dynamics, and a host of other benefits, at least some of which are described in more detail below.

Reference is now made to FIGS. 1A-1C, where FIGS. 1A and 1B illustrate a hybrid suspension system 100, and FIG. 1C illustrates a tractor-trailer vehicle including the hybrid suspension system 100. As used herein, the term hybrid suspension system is meant to convey to a person of skill in the art having benefit of the present disclosure, a range of embodiments in which some or all components of a supplemental electrically driven axle, often (though not necessarily) including a controller, a power source, brake line sensors, CANbus or SAE J1939 type interfaces, sensor packages, off-vehicle radio frequency (RF) communications and/or geopositioning interfaces, etc. are packaged or integratable with components that mechanically interface one or more axles and wheels to the frame or structure of a vehicle and which typically operate (or interface with additional components) to absorb or dampen mechanical perturbations and maintain tire contact with a roadway during travel thereover. In some though not all embodiments, a hybrid suspension system can take on the form or character of an assembly commonly referred to in the U.S. trucking industry as a slider box. In some though not all embodiments, a hybrid suspension system may be or become more integral with a vehicle frame and need not have the modular or fore/aft adjustability commonly associated with slider boxes.

Likewise, the "hybrid" or hybridizing character of a hybrid suspension system, such as hybrid suspension system 100, will be understood by persons of skill in the art having benefit of the present disclosure in the context of its role in hybridizing the sources of motive force or torque available in an over-the-road vehicle configuration that includes it. Accordingly, a hybrid suspension system including an electrically driven axle and controller for coordinating its supplementation of motive force or torques need not, and typically does not itself include, the additional drive axles driven by the fuel fed engine to which it contributes a hybrid or hybridizing source of motive force or torque. Thus, the configuration of a tractor-trailer vehicle (160) illustrated in FIG. 1C is exemplary and will be understood to include a hybrid suspension system, notwithstanding the ability of the trailer (170) to be decoupled from tractor units (e.g., tractor unit 165) that provide the fuel fed engine and primary drivetrain to which it acts as a supplement. Correspondingly, a vehicle such as a heavy truck having a single frame or operable as or with tandem trailers (not specifically shown in FIG. 1C) will be understood to be amenable to inclusion of one or more hybrid suspension systems.

In view of the foregoing, and without limitation, hybrid suspension system-type embodiments are now described with respect to specific examples.

Hybrid Suspension System

As described in more detail below, the hybrid suspension system 100 may include a frame 110, a suspension, one or more drive axles (e.g., such as a drive axle 120), at least one electric motor-generator (e.g., such as an electric motor-generator 130) coupled to the at least one or more drive axles, an energy storage system (e.g., such as a battery array 140), and a controller (e.g., such as a control system 150). In accordance with at least some embodiments, the hybrid suspension system 100 is configured for attachment beneath a trailer. As used herein, the term "trailer" is used to refer to an unpowered vehicle towed by a powered vehicle. In some cases, the trailer may include a semi-trailer coupled to and towed by a truck or tractor (e.g., a powered towing vehicle). By way of example, FIG. 1C illustrates a tractor-trailer vehicle 160 that includes a tractor unit 165 coupled to and operable to tow a trailer 170. In particular, and in accordance with embodiments of the present disclosure, the hybrid suspension system 100 is coupled underneath the trailer 170, as a replacement to a passive suspension assembly, as discussed in more detail below. For purposes of this discussion, the tractor unit 165 may be referred to generally as a "powered towing vehicle" or simply as a "powered vehicle".

To be sure, embodiments of the present disclosure may equally be applied to other types of trailers (e.g., utility trailer, boat trailer, travel trailer, livestock trailer, bicycle trailer, motorcycle trailer, a gooseneck trailer, flat trailer, tank trailer, farm trailer, or other type of unpowered trailer) towed by other types of powered towing vehicles (e.g., pickup trucks, automobiles, motorcycles, bicycles, buses, or other type of powered vehicle), without departing from the scope of this disclosure. Likewise, although components are introduced and described in the context of an exemplary suspension assembly for a trailer, persons of skill in the art having benefit of the present disclosure will appreciate adaptations of configurations and components introduced in the exemplary trailer context to supplemental electrically driven axle applications such as affixed (or suitable for affixing) underneath a vehicle (e.g., a truck, tractor unit, trailer, tractor-trailer or tandem configuration, etc.).

Vehicles may utilize a variety of technologies and fuel types such as diesel, gasoline, propane, biodiesel, ethanol (E85), compressed natural gas (CNG), hydrogen internal combustion engine (ICE), homogeneous charge compression ignition (HCCI) engine, hydrogen fuel cell, hybrid electric, plug-in hybrid, battery electric, and/or other type of fuel/technology. Regardless of the type of technology and/or fuel type, the powered towing vehicle (or more generally the fuel-fed engine of a powered vehicle) may have a particular fuel efficiency. As described below, and among other advantages, embodiments of the present disclosure provide for improved fuel efficiency of the powered vehicle, as described in more detail herein. More generally, and in accordance with various embodiments, the hybrid suspension system 100 described herein is configured (or may be adapted) for use with any type of trailer or powered vehicle.

In some embodiments, the hybrid suspension system 100 includes one or more on-board sensors. As used herein, the term "on-board sensors" may be used to describe sensors that are coupled to or part of the hybrid suspension system 100, sensors that are coupled to or part of a trailer to which the hybrid suspension system 100 is attached, as well as remote sensors that may communicate (e.g., by way of cellular, wireless, RF, satellite, or other such communication) data to a receiver or transceiver that is coupled to or part of the hybrid suspension system 100 or the trailer. In some embodiments, the described sensors may be coupled to or part of a tractor (e.g., the tractor unit 165) to which the trailer is coupled. In various embodiments, the sensors may include one or more of a brake pressure sensor, an altitude and heading reference system, one or more smart sensors which may include a global positioning system as well as other smart sensors and/or telematics systems, a trailer weight sensor which may include an air bag pressure sensor (e.g., provided in a suspension assembly of the towed vehicle) or other type of weight sensor, a speed sensor, a gyroscope, an accelerometer, a magnetometer, a lateral acceleration sensor, a torque sensor, an inclinometer, and/or other suitable sensor.

In addition, the hybrid suspension system 100 is configured to operate largely independently of the fuel-fed engine and primary drivetrain of a powered vehicle and, in some cases, autonomously from the engine and drivetrain controls of the powered vehicle. As used herein, "autonomous" operation of the hybrid suspension system 100 is terminology used to describe an ability of the hybrid suspension system 100 to operate without commands or signals from the powered towing vehicle, to independently gain information about itself and the environment, and to make decisions and/or perform various functions based on one or more algorithms stored in the controller. "Autonomous" operation does not preclude observation or estimation of certain parameters or states of a powered vehicle's fuel-fed engine or primary drivetrain; however, in some embodiments of the present invention(s), electrically driven axles are not directly controlled by an engine control module (ECM) of the powered vehicle and, even where ECMS or adaptive ECMS-type control strategies are employed, no single controller manages control inputs to both the supplemental electrically driven axle(s) and the primary fuel-fed engine and drivetrain.

A trailer, as typically an unpowered vehicle, includes one or more passive axles. By way of example, embodiments of the present disclosure provide for replacement of the one or more passive trailer axles with one or more powered axles. For example, in at least some embodiments, the hybrid suspension system 100 may replace a passive tandem axle with a powered tandem axle, as shown in the example of FIG. 1C. In accordance with some embodiments the present invention(s), the hybrid suspension system 100 can be configured to provide, in a first mode of operation, a motive rotational force (e.g., by an electric motor-generator coupled to a drive axle) to propel the hybrid suspension system 100, and thus the trailer under which is attached, thereby providing an assistive motive force to the powered towing vehicle. Thus, in some examples, the first mode of operation may be referred to as a "power assist mode." Additionally, in some embodiments, the hybrid suspension system 100 is configured to provide, in a second mode of operation, a regenerative braking force (e.g., by the electric motor-generator coupled to the drive axle) that charges an energy storage system (e.g., the battery array). Thus, in some examples, the second mode of operation may be referred to as a "regeneration mode." In some examples, the hybrid suspension system 100 is further configured to provide, in a third mode of operation, neither motive rotational nor regenerative braking force such that the trailer and the attached hybrid suspension system 100 are solely propelled by the powered towing vehicle to which the trailer is coupled. Thus, in some examples, the third mode of operation may be referred to as a "passive mode."

In providing powered axle(s) to the trailer (e.g., by the hybrid suspension system 100), embodiments of the present disclosure result in a significant reduction in both fuel consumption and any associated vehicle emissions, and thus a concurrent improvement in fuel efficiency, of the powered towing vehicle. In addition, various embodiments may provide for improved vehicle acceleration, vehicle stability, and energy recapture (e.g., via regenerative braking) that may be used for a variety of different purposes. For example, embodiments disclosed herein may use the recaptured energy to apply the motive rotational force using the electric motor-generator and/or to provide an auxiliary power unit (APU) that may be used for powering a lift gate, a refrigeration unit, a heating ventilation and air conditioning (HVAC) system, pumps, lighting, communications systems, or other accessory devices (e.g., during a stopover). It is noted that the above advantages and applications are merely exemplary, and additional advantages and applications will become apparent to those skilled in the art upon review of this disclosure.

Referring again to FIG. 1A, illustrated therein is a bottom view of an exemplary hybrid suspension system 100 which shows the frame 110, the drive axle 120, a passive axle 125, and wheels/tires 135 coupled to ends of each of the drive axle 120 and the passive axle 125. In some embodiments, the electric motor-generator 130 is coupled to the drive axle 120 by way of a differential 115, thereby allowing the electric motor-generator 130 to provide the motive rotational force in the first mode of operation, and to charge the energy storage system (e.g., the battery array) by regenerative braking in the second mode of operation. Note that in some embodiments, components such as the electric motor-generator, gearing and any differential may be more or less integrally defined, e.g., within a single assembly or as a collection of mechanically coupled components, to provide an electrically driven axle. While shown as having one drive axle and one passive axle, in some embodiments, the hybrid suspension system 100 may have any number of axles, two or more drive axles, as well as multiple electric motor-generators on each drive axle. In addition, axles of the hybrid suspension system (e.g., the drive axle 120 and the passive axle 125) may be coupled to the frame 110 by a leaf spring suspension, an air suspension, a fixed suspension, a sliding suspension, or other appropriate suspension. In some embodiments, the wheels/tires 135 coupled to ends of one or both of the drive axle 120 and the passive axle 125 may be further coupled to a steering system (e.g., such as a manual or power steering system), thereby providing for steering of the hybrid suspension system 100 in a desired direction.

With reference to FIG. 1B, illustrated therein is a top view of the hybrid suspension system 100 showing the battery array 140 and the control system 150. In various embodiments, the battery array 140 and the control system 150 may be coupled to each other by an electrical coupling 145. In addition, the electric motor-generator 130 may be coupled to the control system 150 and to the battery array 140, thereby providing for energy transfer between the battery array 140 and the electric motor-generator 130. In various examples, the battery array 140 may include one or more of an energy dense battery and a power dense battery. For example, in some embodiments, the battery array 140 may include one or more of a nickel metal hydride (NiMH) battery, a lithium ion (Li-ion) battery, a lithium titanium oxide (LTO) battery, a nickel manganese cobalt (NMC) battery, a supercapacitor, a lead-acid battery, or other type of energy dense and/or power dense battery.

For purposes of this discussion, the hybrid suspension system 100, the coupled trailer, and the powered vehicle may be collectively referred to as "a hybrid trailer vehicle system (HTVS)". Thus, in some embodiments, the tractor-trailer vehicle 160 of FIG. 1C may be referred to as an HVTS.

Control Methods, Generally

Figure 2:
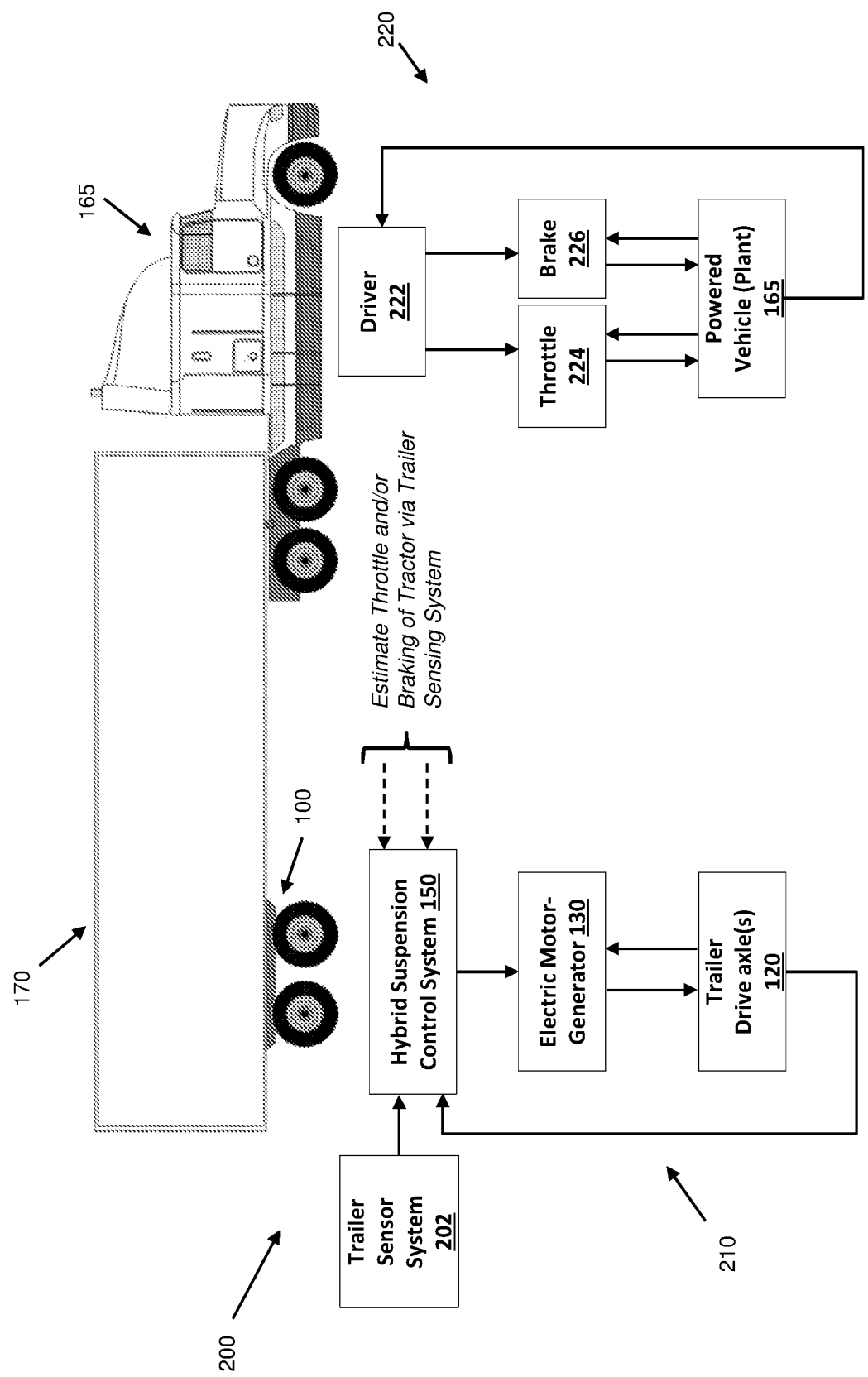
FIG. 2 is an exemplary functional block diagram illustrating control of an on-trailer hybrid suspension system, in accordance with some embodiments.

With reference now to FIG. 2, illustrated therein is an exemplary functional block diagram 200 for controlling the hybrid suspension system 100, described above. In particular, the block diagram 200 illustrates exemplary relationship, in at least some embodiments, among various components of an HVTS, such as the tractor-trailer vehicle 160 of FIG. 1C. FIG. 2. For example, FIG. 2 illustrates the autonomous nature of the hybrid suspension system 100, where the hybrid suspension system 100 is able to operate without direct commands or signals from the powered towing vehicle (e.g., such as the tractor unit 165), to independently gain information about itself, the trailer 170, and the environment (e.g., by way of the trailer sensing system), and to make decisions and/or perform various functions based on one or more algorithms stored in the control system 150.

The autonomous nature of the hybrid suspension system 100 is further exemplified, in at least some embodiments, by the functional block diagram 200 including two separate control loops, a hybrid suspension system control loop 210 and a powered towing vehicle control loop 220. In the powered vehicle control loop 220, a driver 222 may apply a throttle 224 or a brake 226, which is then applied to the powered vehicle (e.g., such as the tractor unit 165). In various embodiments, a response of the powered vehicle to the applied throttle 224/brake 226 (e.g., acceleration/deceleration of the powered vehicle) may be provided as feedback to the driver 222, which the driver 222 may then further respond to by applying additional throttle 224 or brake 226, or neither throttle 224/brake 226. In some examples, the powered vehicle may also provide feedback (e.g., to the driver 222) via throttle 224/brake 226 inputs.

Independent from the powered vehicle control loop 220, the hybrid suspension control system 150 may receive trailer data from a trailer sensor system 202, which may include any of the one or more sensors discussed above. In some cases, the trailer sensor system 202 may include the on-board sensors discussed above. In some embodiments, the control system 150 may compute a total estimated torque and computationally estimate a torque applied by the tractor unit 165 (e.g., which may include estimating throttle and/or braking). In some embodiments, based on the total estimated torque and the computationally estimated torque of the powered vehicle, a specified trailer torque may be computed and applied to the one or more trailer axles 120, by way of the electric motor-generator 130. In various examples, the driven one or more trailer axles 120 may provide feedback to the control system 150, for further computation and application of torque. In some cases, the one or more driven trailer axles 120 may also provide feedback to the electric motor-generator 130. In at least some embodiments, the hybrid suspension system 100 may sense one or more pneumatic brake lines from the powered vehicle.

Control Methods, Examples and Further Discussion

The hybrid suspension system 100 may be used, for example together with aspects of the control methods described above, to operate in a variety of different modes (e.g., power assist, regeneration, and passive modes) and thus perform a variety of different functions. In various examples, the hybrid suspension system 100 may be used to provide a power boost (e.g., to the HVTS) during acceleration and/or when going up an incline by operating in the power assist mode, thereby depleting energy from the energy storage system. In addition, the hybrid suspension system 100 may replenish that energy by operating in the regeneration mode (e.g., using regenerative braking) when decelerating and/or when going down a decline. As discussed above, operation in one of the various modes may be determined according to a variety of inputs and/or data (e.g., from sensors, calculated values, etc.) such as discussed above. In various examples, the hybrid suspension system 100 and associated methods may provide, among other benefits, optimal application of power (e.g., as discussed in the example below), increased fuel mileage, decreased fuel emissions, and superior load stabilization. Of particular note, embodiments of the hybrid suspension system 100 described herein are configured to operate generally independently of the powered vehicle to which the trailer may be attached. Thus, any type of powered vehicle may hook up and tow a trailer, including the hybrid suspension system 100 attached thereunder, and the hybrid suspension system 100 will automatically adapt to the powered vehicle's behavior.

With respect to optimal application of power as discussed above, there are scenarios in which battery power could be used most effectively at a given time, for example, knowing that battery power may be (i) regenerated in the near future (e.g., based on an upcoming downhill roadway grade) or (ii) needed in the near future (e.g., based on an upcoming uphill roadway grade). Such information (e.g., regarding the upcoming roadway) may be gathered from GPS data, inclinometer data, and/or other sensor data as described above. In some embodiments, the hybrid suspension system 100 may alternatively and/or additionally periodically query a network server, or other remote server/database, to provide an upcoming roadway grade.

For purposes of illustration, consider an example where an HTVS is traveling along substantially flat terrain, while the battery array 140 of the hybrid suspension system 100 is at about a 70% state of charge (SOC). Consider also that there is an extended downhill portion of roadway coming up that would provide for regeneration of about 40% SOC of the battery array 140 (e.g., while operating the hybrid suspension system 100 in the regeneration mode). Absent knowledge of the upcoming extended downhill portion of the roadway, some embodiments may operate in the passive mode on the substantially flat terrain, while beginning to regenerate the battery array 140 once the HTVS reaches the extended downhill portion of roadway. In such cases, about 30% SOC may be regenerated before the battery array 140 is fully charged. Thus, the system may not be able to regenerate further, and about 10% SOC that could have been captured may be lost.

In some embodiments, the predictive road ability discussed herein provides knowledge of the upcoming extended downhill portion of roadway. As such, the hybrid suspension system 100 may autonomously engage the power assist mode while traveling along the substantially flat terrain, such that about 10% SOC of the battery array 140 is used prior to reaching the extended downhill portion of roadway, thereby improving fuel efficiency of the HTVS (e.g., while on the substantially flat terrain), while still regenerating about 30% SOC while traveling along the extended downhill portion. Such system operation, including the predictive road ability, advantageously provides for both improved fuel efficiency of the HTVS efficient use of the battery array 140 (e.g., as it may be undesirable to have the battery array nearly full or nearly empty when there is an opportunity to regenerate or provide power assistance).

In another example, consider a case where the battery array 140 is at about 10% SOC and the HTVS is traveling along substantially flat terrain. Consider also that an extended uphill portion of roadway is coming up that would optimally be able to use about 20% SOC of the battery array 140 (e.g., while operating the hybrid suspension system 100 in the power assist mode). Once again, absent knowledge of the upcoming extended uphill portion of the roadway, some embodiments may operate in the passive mode on the substantially flat terrain, while beginning to use energy (e.g., operating in the power assist mode) once the HTVS reaches the extended uphill portion of the roadway. Thus, in such an example, the battery array 140 may expend its 10% SOC before the hybrid suspension system 100 may not be able to assist further. Stated another way, about 10% SOC that could have been effectively used by the HTVS while traveling along the extended uphill portion of the roadway is not available.

As discussed above, the predictive road ability provides knowledge of the upcoming extended downhill portion of roadway. As such, the hybrid suspension system 100 may autonomously engage the regeneration mode while traveling along the substantially flat terrain, such that about 10% SOC of battery array 140 is regenerated, for a total of about 20% SOC, prior to reaching the extended uphill portion of the roadway. While this may result in a temporary decrease in fuel efficiency, the efficiency gains afforded by operating the hybrid suspension system 100 in the power assist mode for the duration of the extended uphill portion of the roadway (e.g., and optimally using the 20% SOC of the battery array 140) outweigh any potential efficiency reductions that may occur by regenerating on the substantially flat terrain.

In addition to using the various sensors, data, networking capabilities, etc. to determine whether the HTVS is traveling along substantially flat terrain, uphill, or downhill, embodiments of the present disclosure may be used to determine whether the HTVS is hitting a bump or pothole, turning a corner, and/or accelerating. By accounting for dynamics of the vehicle and measuring angles and accelerations (e.g., in 3-dimensional space), embodiments of the present disclosure may provide for measurement of: (i) acceleration, deceleration, and angle of inclination of the vehicle (e.g., by taking readings lengthwise), (ii) side-to-side (e.g., turning force) motion and banking of a roadway (e.g., by taking readings widthwise), (iii) smoothness of the roadway, pot holes, and/or wheels riding on a shoulder (side) of the road (e.g., by taking readings vertically). Utilizing such information, embodiments of the present disclosure may be used to brake wheels individually, for example, while still supplying power (e.g., by the power assist mode) to other wheels, thereby increasing vehicle stability. In addition, and in some embodiments, by monitoring the acceleration, axle speed and incline of the roadway over time and by applying an incremental amount of torque and measuring the response in real time, the controller may back-calculate a mass of the trailer load. In some embodiments, a weight sensor may also be used, as described above. In either case, such information may be used by the system for application of a proper amount of torque to assist in acceleration of the HTVS without over-pushing the powered vehicle.

In some examples, the system may further be used to monitor one or more pneumatic brake lines, such that embodiments of the present disclosure provide a 'failsafe' mode where the hybrid suspension system 100 will not accelerate (e.g., operate in a power assist mode) while a driver (e.g. of the powered vehicle) is actuating a brake system. In various embodiments, by monitoring feedback pressure of each wheel's brake lines, as well as their respective wheel speeds, the present system can determine how each brake for a particular wheel is performing. Thus, in various examples, embodiments of the present disclosure may provide for braking and/or powering of different wheels independently from one another for increased vehicle stability. In some cases, this may be referred to as "torque vectoring". By way of example, such torque vectoring embodiments may be particularly useful when there are differences in roadway surfaces upon which each of a plurality of wheels of the HTVS is traveling (e.g., when roadway conditions are inconsistent, slippery, rough, etc.).

Embodiments disclosed herein may further be employed to recapture energy via regenerative braking, as described above. In some examples, the application of the brakes, and/or various combinations of deceleration, axle speed, vehicle weight and incline/decline readings may dictate, at least in part, an ability and amount of regeneration possible by the hybrid suspension system 100. In various embodiments, regenerative braking may persist until the energy storage system is fully charged, until a predetermined minimum level of stored energy has been achieved, or until the powered trailer axle has reached a minimum threshold rotational speed. Additionally, for example in some extreme conditions, different amounts of braking may be applied to each wheel in order to reduce a potential of jack-knifing or other dangerous conditions during operation of the HTVS. As a whole, regenerative braking may be used to lighten a load on a mechanical braking system (e.g., on the powered vehicle and/or on the trailer), thereby virtually eliminating a need for a loud compression release engine brake system (e.g., Jake brake system). In some cases, by applying both regenerative braking and friction braking, the HTVS may be able to brake much faster and have shorter stopping distances. In addition, and in various embodiments, the present system may be deployed with two pneumatic brake lines (e.g., which may including existing brake lines), while an entirety of the controls (e.g., including sensor input processing, mode of operation control, aspects of the various methods described above, and other decision-making controls) may reside entirely within the hybrid suspension system 100 itself (e.g., and in many respects, within the control system 150). To be sure, in some examples, the controls may equally or alternatively reside in other components of the systems 400, 450, discussed below with reference to FIGS. 4A, 4B, and 4C, such as within AHED units, user devices 420, remote server 402, GIS server 416, or combinations thereof.

Energy Capture and Management, Further Discussion

With respect to energy recapture, the above discussion is primarily directed to charging the energy storage system (e.g., the battery array) by regenerative braking; however, other methods of energy recapture are possible and within the scope of this disclosure. For example, in some embodiments, a hydraulic system (e.g., used to capture energy via air pressure or fluid pressure), flywheels, solar panels, alternator power, or a combination thereof may be used for energy recapture. Additionally, in some cases, the HVTS 160 may include shocks (e.g., as part of a suspension of the powered vehicle and/or of the hybrid suspension system 100), which may include regenerative shock absorbers, that may be used to capture electrical energy via the motion and/or vibration of the shocks. In some embodiments, energy captured by one or more of the above methods may be used to charge the energy storage system.

Further, embodiments disclosed herein may use the recaptured energy not only to apply the motive rotational force using the electric motor-generator, but also to provide an electric auxiliary power unit (APU) that may be used for powering a host of devices and/or systems, both on the trailer and on the powered vehicle. For example, in various embodiments, the APU may be used to power a lift gate, a refrigeration unit, a heating ventilation and air conditioning (HVAC) system, pumps, lighting, appliances, entertainment devices, communications systems, or other electrically powered devices during a stopover. Regardless of where the power is being provided, embodiments disclosed herein provide for energy storage and management to be on-trailer.

When configured to provide an APU, the HVTS 160 may include an APU interface to provide power from the energy storage system (e.g., the battery array) to the powered vehicle to power one or more devices and/or systems on the powered vehicle. In some embodiments, the APU interface may include an SAE J2891 interface. In various examples, the APU interface may physically couple to an electrical interface on the powered vehicle so that power from the energy storage system may be transferred to the powered vehicle. In some embodiments, an inverter, such as the inverter described above, may be coupled between the energy storage system and the APU interface to supply AC power to the powered vehicle. In some cases, a step-down DC-DC power supply may be coupled between the energy storage system and the APU interface to supply DC power to the powered vehicle. In some embodiments, an electrical cable may be used to transfer electrical power from the energy storage system (which may be on the towed or towing vehicle) to the powered vehicle and for bi-directionally conveying data between the powered vehicle and at least a hybrid control system (which may be on the towed or towing vehicle).

In at least some embodiments, a control interface is provided in the powered towing vehicle. By way of example, the control interface may be coupled to the hybrid control system. In various embodiments, the control interface may provide an in-towing-vehicle (e.g., within a cab of the powered vehicle) display of state of charge for the energy storage system, a switch or control of a switch to enable and disable supply of electrical power to the powered towing vehicle, and/or mode control for selectively controlling an operating mode of the hybrid control system. In some embodiments, and in at least one selectable mode of the hybrid control system, energy recovered using the drive axle in a regenerative braking mode (or energy recovered using one of the other methods described above) is used to bring the energy storage system to a substantially full state of charge. Further, in some embodiments, and in at least another selectable mode of the hybrid control system, state of charge of the energy storage system is managed to a dynamically varying level based at least in part on uphill and downhill grades along a current or predicted route of travel of the HVTS 160. In at least some embodiments, the control interface may be integrated with the HVAC system on the powered towing vehicle, the HVAC system powered from the energy storage system at least during some extended periods of time during which an engine of the towing vehicle is off (e.g., when the HVTS 160 is stopped at a rest area, weigh station, pick-up location, drop-off location, or other location).

In addition, embodiments of the present disclosure may provide for the use of predicted or estimated stopover information to manage a battery state of charge (SOC) so as to provide sufficient power for APU operation at a stopover. In some embodiments, stopover may be predicted based on legally mandated rest and/or based on available stopover sites along a preplanned route schedule, driver preferences, history or other factors. In general, the system alters its ordinary SOC management strategy to control the consumption and/or generation or regeneration of electrical power and to top off batteries in anticipation of a predicted stopover.

In general, by knowing when the APU will be needed (e.g., based on an estimated travel time to a stopover), embodiments of the present disclosure provide for effectively managing the battery SOC (e.g., using the hybrid control system) by balancing use of a fuel-fed engine (e.g., of the powered vehicle) versus use of the battery (e.g., the energy store) that powers one or more electrically powered drive axles. In some embodiments, a dynamic weight value (e.g., within an ECMS algorithm, and referred to in FIGS. 3A, 3B, and 3C as "SOC Lambda") is used to specify usage of the fuel-fed engine relative to usage of the energy store. By dynamically altering the dynamic weight value, and thus by dynamically altering usage of the fuel-fed engine relative to usage of the energy store, a state of charge (SOC) of the battery may be gradually increased as the vehicle approaches a stopover or 'APU needed' location. In general, the higher the SOC of the battery, the lower the dynamic weight value, and more battery energy usage may be acceptable. Similarly, the lower the SOC of the battery, the higher the dynamic weight value, and battery energy usage may be restricted. In various examples, the dynamic weight value is used to target desirable SOC ranges in which to operate.

Figure 3A:
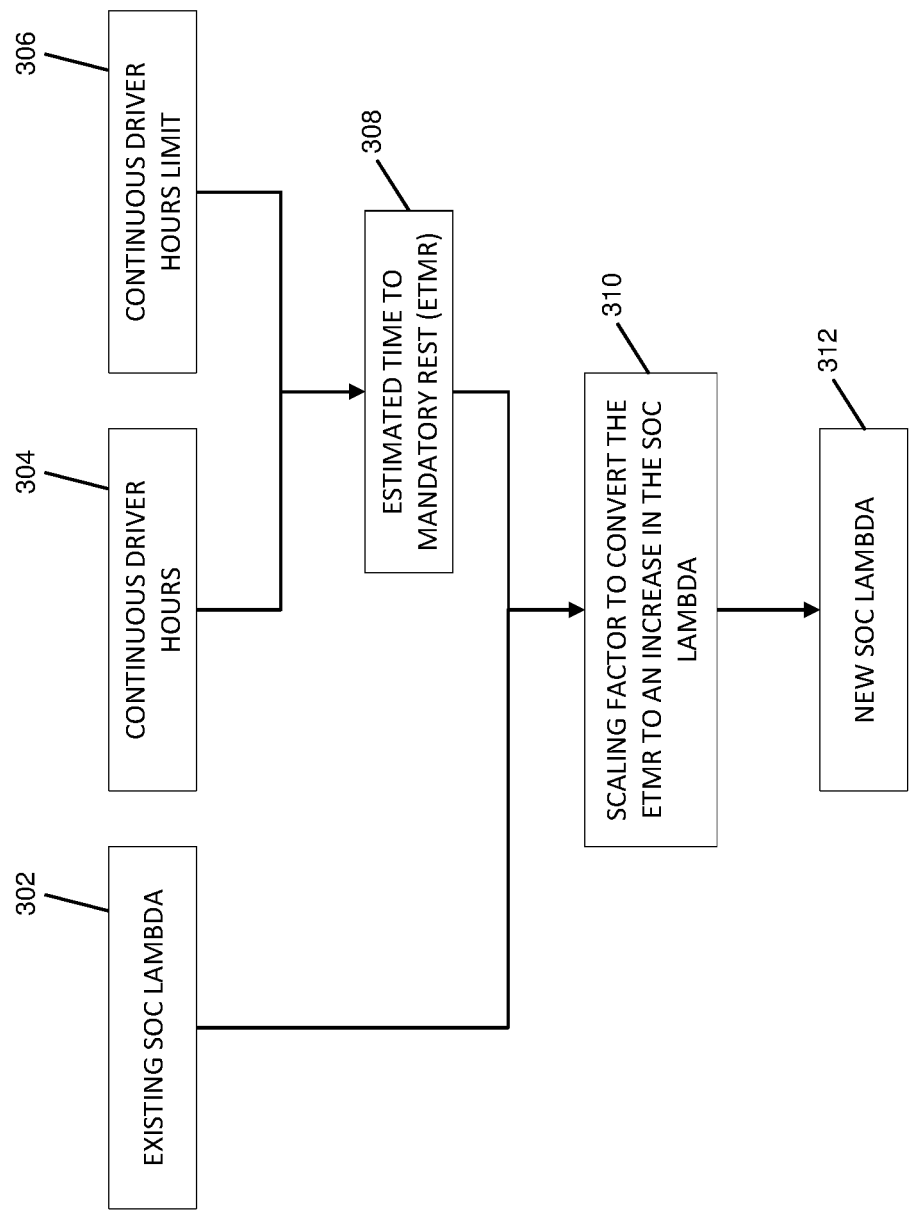
FIG. 3A is an exemplary block diagram illustrating a stopover prediction algorithm based on an estimated travel time to a mandatory rest period, in accordance with some embodiments.

By way of example, the estimated travel time to a stopover (e.g., when the APU will be needed) may be determined by a variety of methods. For instance, as shown in FIG. 3A and in some embodiments, the estimated travel time to a stopover may include an estimated time to a mandatory rest period. In some embodiments, an estimated time to a mandatory rest (ETMR) period (block 308) may be determined by a combination of how long a driver has been on the road (block 304) and how long the driver is legally allowed to be on the road (block 306). For example, due to specific trucking laws, drivers have mandatory rests periods after a given amount of driving time. As one example, consider that a driver has been driving a truck for 7 hours (e.g., in an embodiment of block 304) and the maximum number of driving hours allowed is 8 hours (e.g., in an embodiment of block 306), thereby resulting in an ETMR of one hour (e.g., in an embodiment of block 308). At block 310, a scaling factor may be determined based on the ETMR (block 308), where the scaling factor can be used to change the dynamic weight value (increase the dynamic weight value, in the present example). As such, also at block 310, an existing dynamic weight value (received from block 302) is increased to a new dynamic weight value (at block 312) using the determined scaling factor. Continuing with the illustrative example, and in response to increasing the dynamic weight value based on the ETMR, the SOC of the battery may be gradually increased to a target SOC such that the battery SOC is sufficient to provide power for APU operation at a stopover (e.g., at the mandatory rest period). In some cases, a 90-92% SOC may be sufficient to provide at least 8 hours of APU operation.

Figure 3B:
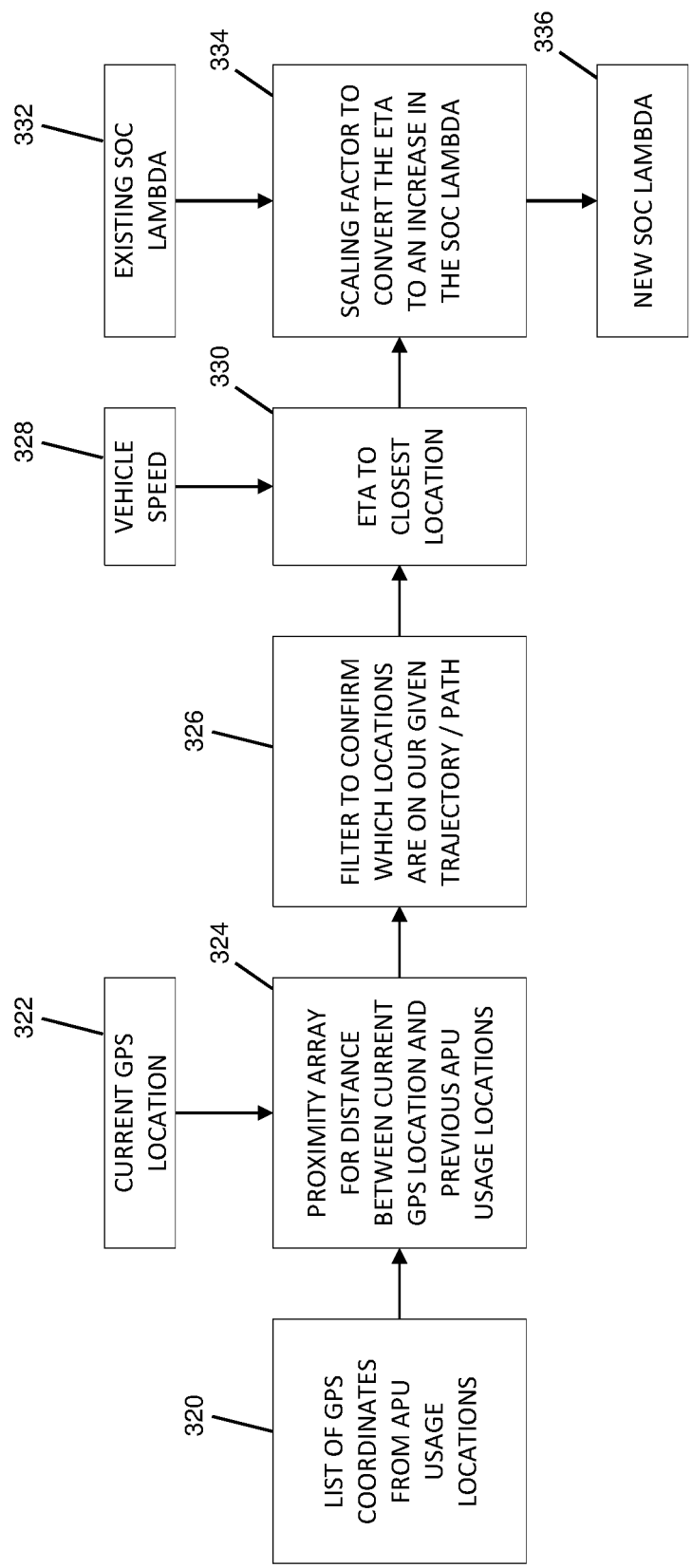
FIG. 3B is an exemplary block diagram illustrating a stopover prediction algorithm based on an estimated travel time to a prior stopover location, in accordance with some embodiments.

In some embodiments, and with reference to FIG. 3B, the estimated travel time to a stopover may include an estimated travel time to a prior stopover location. For example, if a driver has used the APU at a particular stopover location before (e.g., a driver who drives the same route), then the driver is more likely to use the APU again at the particular stopover location. Thus, the SOC of the battery may be gradually increased to a target SOC (e.g., by altering the dynamic weight value) such that the battery SOC is sufficient to provide power for APU operation when the driver reaches the particular stopover location. In general, embodiments of the present disclosure may record and learn where and for how long a driver stops and utilizes the APU.

By way of example, based on a list of GPS coordinates of prior stopover locations (block 320) and a current GPS location (block 322), a distance between the current location and each of the prior stopover locations may be determined (block 324). Various embodiments also provide a "look-ahead" function that determines stopover locations on a driver's projected route, while filtering out stopover locations that are not along the projected route (block 326). In general, the look-ahead functionality described herein may be implemented as software which provides GPS locations of upcoming stopover locations along road segments that are within a driver's projected route. Thus, this look-ahead functionality may be used as a filter to confirm if a previously visited stopover location is on a driver's projected route. At block 330 and based a vehicle speed (328) and distances (block 324), an ETA to the closest prior stopover location, on the driver's projected route (block 326), may be determined. In some cases, driver behaviors (e.g., driving patterns), real-time traffic data, weather information, road conditions, and/or other such factors may also be used to dynamically determine the ETA. At block 334, a scaling factor may be determined based on the ETA (block 330), where the scaling factor is used to change the dynamic weight value. As such, also at block 334, an existing dynamic weight value (received from block 332) is changed (e.g., increased) to a new dynamic weight value (at block 336) using the determined scaling factor. In response to changing the dynamic weight value based on the ETA, the SOC of the battery may be gradually increased to a target SOC such that the battery SOC is sufficient to provide power for APU operation when the driver reaches the prior stopover location.

Figure 3C:
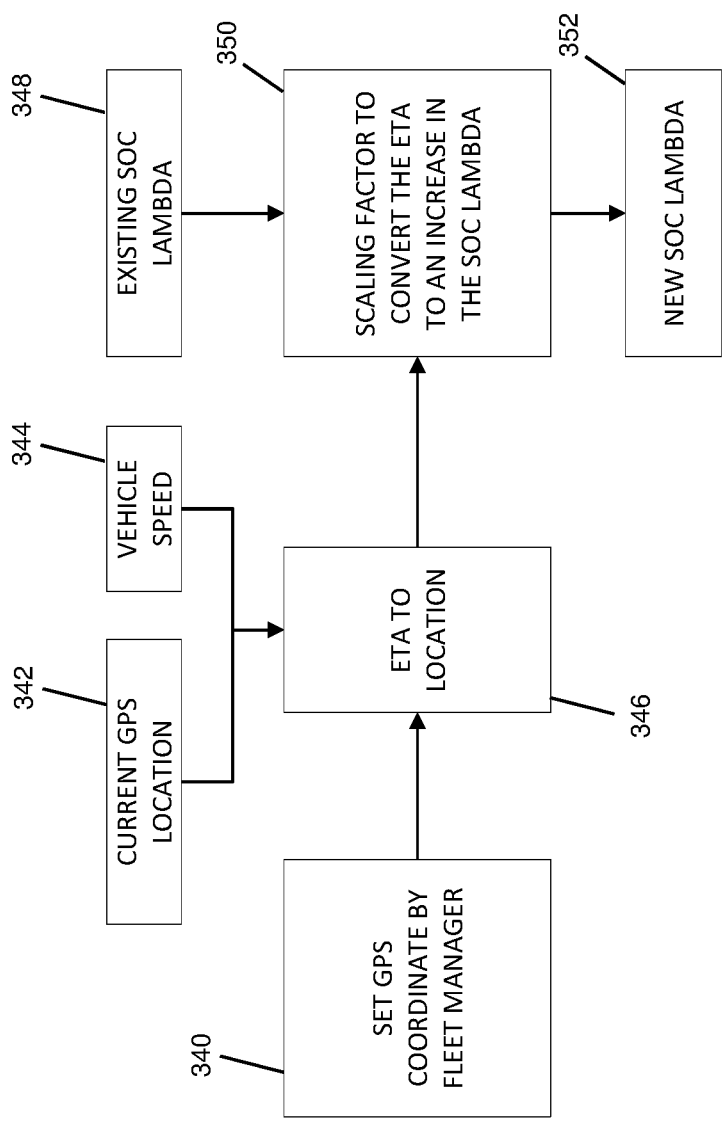
FIG. 3C is an exemplary block diagram illustrating a stopover prediction algorithm based on an estimated travel time to a designated stopover location pre-assigned by a fleet manager or a vehicle operator, in accordance with some embodiments.

In some embodiments, and with reference to FIG. 3C, the estimated travel time to a stopover may include an estimated travel time to a designated stopover location pre-assigned by a fleet manager or a vehicle operator. For example, by taking advantage of the communication between drivers and fleet managers, a fleet manager may submit GPS coordinates for a planned or estimated stopover location for APU usage. Thus, the SOC of the battery may be gradually increased to a target SOC (e.g., by altering the dynamic weight value) such that the battery SOC is sufficient to provide power for APU operation when the driver reaches the planned or estimated stopover location.

For instance, based GPS coordinates for a designated stopover location set by the fleet manager (block 340), an ETA to the designated stopover location may be determined at block 346 based on a current GPS location (block 342) and a vehicle speed (block 344). In some cases, driver behaviors (e.g., driving patterns), real-time traffic data, weather information, road conditions, and/or other such factors may also be used to dynamically determine the ETA. At block 350, a scaling factor may be determined based on the ETA (block 346), where the scaling factor is used to change the dynamic weight value. Thus, also at block 350, an existing dynamic weight value (received from block 348) is changed (e.g., increased) to a new dynamic weight value (at block 352) using the determined scaling factor. In response to changing the dynamic weight value based on the ETA, the SOC of the battery may be gradually increased to a target SOC such that the battery SOC is sufficient to provide power for APU operation when the driver reaches the stopover location designated by the fleet manager.

In some embodiments, the system disclosed herein may include an "APU Prep" mode, which for example may be manually engaged by a driver via a user device within a cab of the towing vehicle. However, whether or not the driver engages the APU Prep mode, embodiments of the present disclosure provide for proactively and dynamically altering the dynamic weight value, and thus dynamically altering usage of the fuel-fed engine relative to usage of the energy store, such that the SOC of the battery may be gradually increased as the vehicle approaches a stopover or 'APU needed' location.

Exemplary Network Design

As discussed above, the hybrid suspension system 100 may in some cases query a network-connected server, database, or other network-connected service platform, for information regarding an upcoming roadway grade. The hybrid suspension system 100, and more generally any of a plurality of tractor-trailer vehicles 160, may be configured to communicate with the network server or other remote server/database to provide the various functionality disclosed herein, or other features and/or functionality.

Figure 4A:
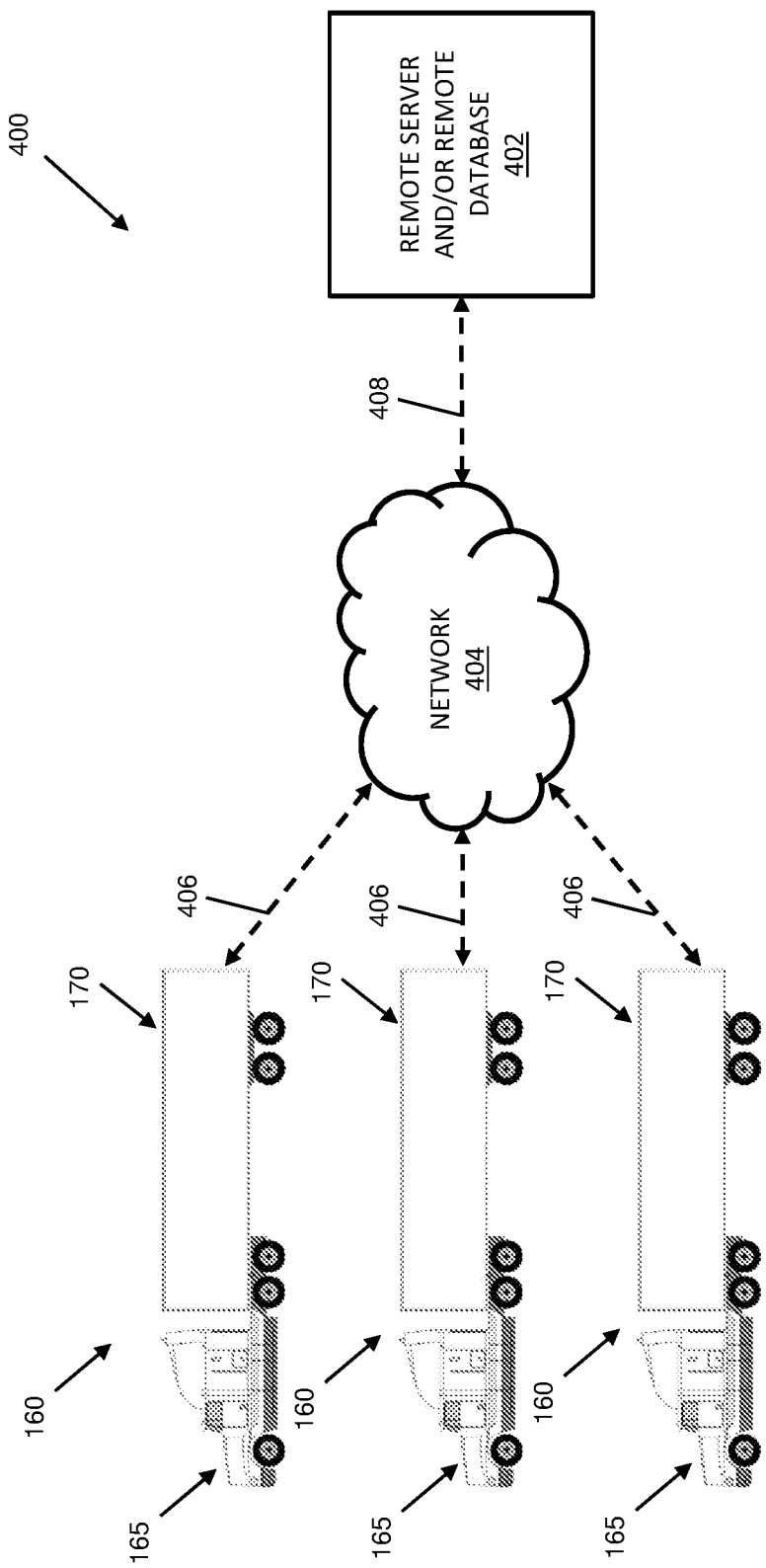
FIG. 4A is an exemplary system for providing communication between a tractor-trailer vehicle and a network server or remote server/database, according to some embodiments.

For example, and with reference to FIG. 4A, an exemplary system 400 for providing communication between a tractor-trailer vehicle and a network-connected service platform is shown. In some embodiments, one or more tractor-trailer vehicles 160 are configured to communicate with a remote server 402 by way of a network 404, using one or more network communication devices.

The network 404 may be implemented as a single network or a combination of multiple networks. For example, in various embodiments, the network 404 may include the Internet and/or one or more intranets, landline networks, wireless networks, cellular networks, satellite networks, point-to-point communication links, and/or other appropriate types of networks. In some examples, the one or more tractor-trailer vehicles 160 and the remote server 402 may communicate through the network 404 via cellular communication, by way of one or more user-side network communication devices or server-side network communication devices. Thus, as merely one example, connections 406 between the one or more tractor-trailer vehicles 160 and the network 404 may include a 3G cellular connection, a universal mobile telecommunications system (UMTS) connection, a high-speed packet access (HSPA) connection, a 4G/LTE connection, a combination thereof, or other appropriate connection now existing or hereafter developed. Further, in an example, a connection 408 between the network 404 and the remote server 402 may include an Internet trunk connection. The Internet truck connection may be used to simultaneously provide network access to a plurality of clients, for example, such as the one or more tractor-trailer vehicles 160.

In other examples, the one or more tractor-trailer vehicles 160 and the remote server 402 may communicate through the network 404 via wireless communication (e.g., via a WiFi network), by way of one or more user-side network communication devices or server-side network communication devices. In yet other examples, the one or more tractor-trailer vehicles 160 and the remote server 402 may communicate through the network 404 via any of a plurality of other radio and/or telecommunications protocols, by way of one or more user-side network communication devices or server-side network communication devices. While some examples of communication between the one or more tractor-trailer vehicles 160 and the remote server 402 have been provided, those skilled in the art in possession of the present disclosure will recognize other network configurations, components, and/or protocols that may be used, while remaining within the scope of the present disclosure.

Figure 4B:
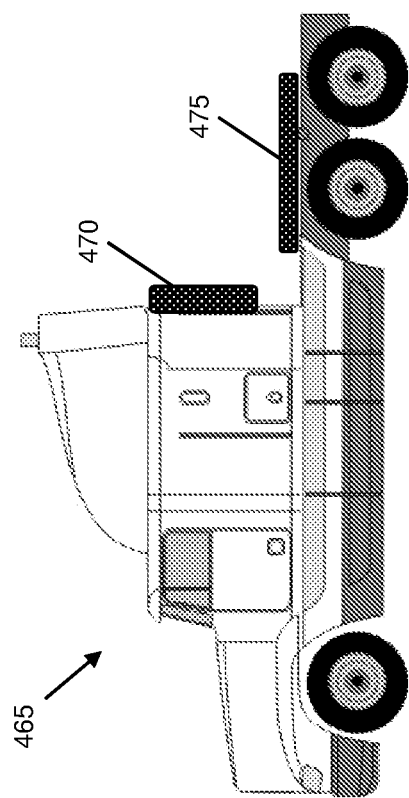
FIG. 4B is an exemplary tractor unit suitable for implementation within the system of FIG. 4A, in accordance with some embodiments.

Referring now to FIG. 4B, an exemplary tractor unit 465 suitable for implementation within the system 400 is provided. In some embodiments, the tractor unit 465 may be substantially similar to the tractor unit 165 described above. As shown, the tractor unit 465 may include an autonomous hybrid electric drive (AHED) unit including a management and control mobile controller (MCOMCTLR) 470 and a hybrid auxiliary device controller (HADCTLR) 475. In some cases, one or more features of, or functions provided by, the AHED unit may be included within or provided by the control system 150, described above. Stated another way, and in some embodiments, the control system 150 may be used to implement the various functions of the AHED unit described herein. In addition, the AHED unit described herein may serve to implement the hybrid control system, described above. In some embodiments, the AHED unit may provide various operating modes such as a hybrid (autonomous) operating mode, the APU Prep mode (discussed above), an APU mode (e.g., where the AHED unit operates as an APU), a manual control mode (including sub-modes such as neutral, drive, regen, sleep, update), and an anti-theft mode (e.g., that may disable one or more functions of the tractor-trailer vehicle 160). Generally, in various cases, the AHED unit may be configured for communication with the remote server 402 by way of the network 404. In some examples, the AHED unit may be used to transmit component/asset and telematics data to the remote server 402. While shown as attached to portions of the tractor unit 465, in some cases, the AHED unit or components thereof (e.g., one or both of the MCOMCTLR 470 and the HADCTLR 475) may alternatively be attached to portions of a trailer (e.g., the trailer 170) towed by the tractor unit.

The MCOMCTLR 470 more specifically may function as a management, algorithmic, and communications module for the AHED unit. For example, the MCOMCTLR 470 may be used to connect to the remote server 402 via the network 404, and to the HADCTLR 475 via a CAN V2.0 connection. In various embodiments, the MCOMCTLR 470 has cellular, GPS, data protocol, algorithmic, statistical and system management responsibilities. For instance, the MCOMCTLR 470 manages messaging, events, and reporting to the remote server 402, performs the Autonomous/Hybrid Control algorithm (e.g., including the examples described above), provides error detection and recovery, monitors the HADCTLR 475, gathers and reports GPS information (e.g., to the remote server 402), manages over the air updates, and provides a single management interface to the remote server 402.

The HADCTLR 475, in some cases, includes an embedded controller disposed within a grounded, low-voltage (GLV) enclosure. The HADCTLR 475 may be used to control system relays, component initialization sequences, and SAE J1939 message capture and forwarding. A select set of SAE J1939 messages may be forwarded to the MCOMCTLR 470 for algorithmic and statistical processing via the internal CAN bus. By way of example, the HADCTLR 475 manages device activation via relays driven by CAN messages (e.g., devices such as an AC Motor controller, a battery management system, a DC/DC Inverter, an altitude and heading reference system (AHRS), temperature sensors, or other such devices), maintains and sends state information to the MCOMCTLR 470, and captures J1939 bus CAN messages (e.g., from the tractor unit 465) and forwards the select set of J1939 messages to the MCOMCTLR 470, as noted.

Figure 4C:
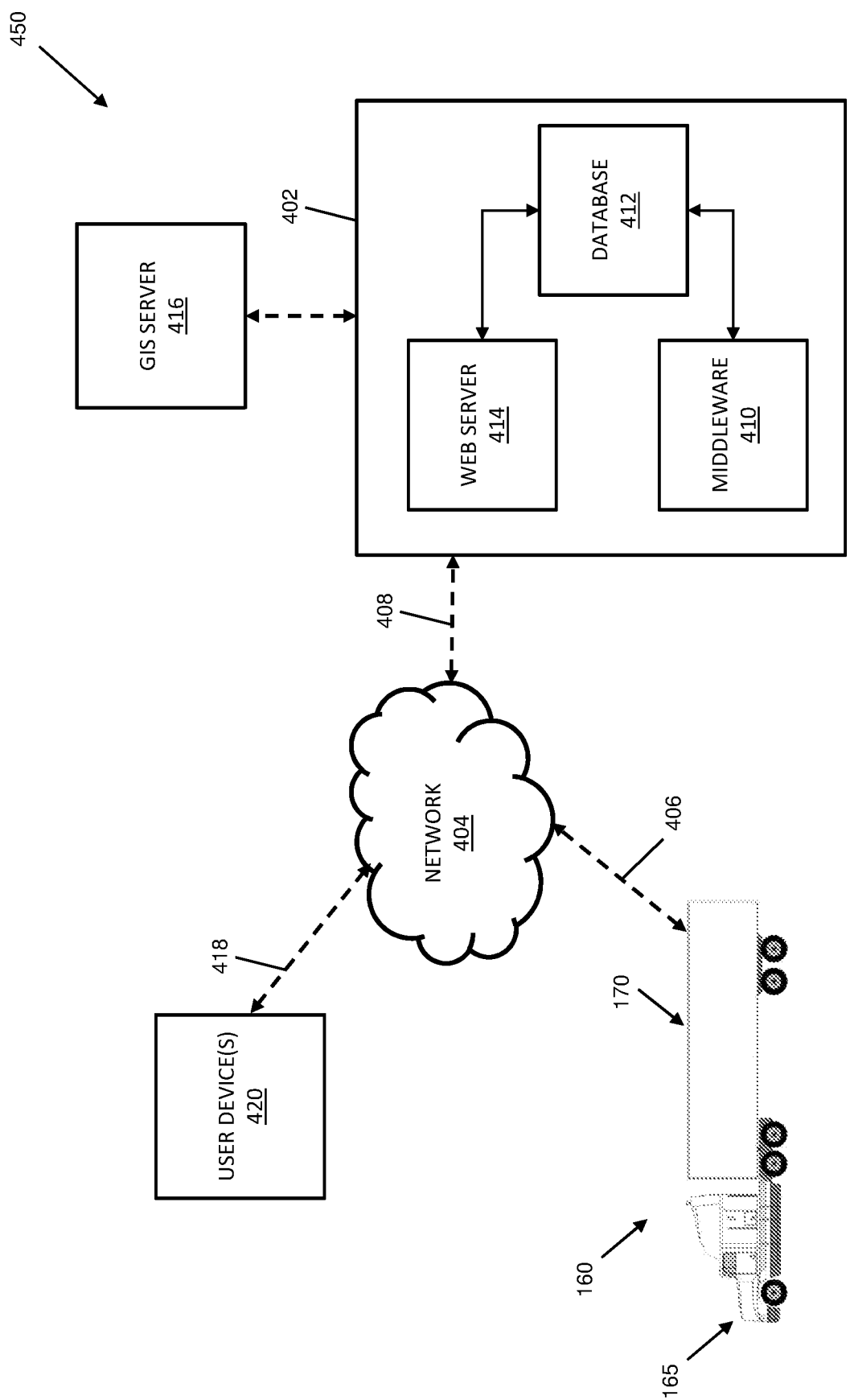
FIG. 4C is another exemplary system for providing communication between a tractor-trailer vehicle and a network server or remote server/database, according to some embodiments.

With reference to FIG. 4C, illustrated therein is an exemplary system 450 for providing communication between a tractor-trailer vehicle and a network server or remote server/database. Various aspects of the system 450 are substantially the same as the system 400, discussed above. Thus, for clarity of discussion, some features may only be briefly discussed. FIG. 4C, in particular, provides a more detailed view of the remote server 402. As shown, the remove server 402 may include a middleware component 410, a database 412, and a web server 414. In various examples, each of the middleware 410, the database 412, and the web server 414 may be implemented using separate machines (e.g., computers/servers), or may be collocated on a single machine. The middleware 410 may be configured to receive and process data (e.g., from the AHED unit) and store the data in the database 412. The database 412 may be used to store any such data received from AHED units of any of a number of tractor-trailer vehicles 160, as well as to store customer/user account information, and store asset tracking information (e.g., for tracking the tractor-trailer vehicles 160). In some examples, the database 412 is implemented using a PostgreSQL object-relational database management system, enabling multi-node clustering. The web server 414 can be used to store, process, and deliver web pages (e.g., that provide a user-interface) to any of a plurality of users operating user devices 420. In some embodiments, the user devices 420 may include any type of computing device such as a laptop, a desktop, a mobile device, or other appropriate computing device operated by any type of user (e.g., individual, driver, fleet manager, or other type of user). In some examples, connections 418 between the user devices 420 and the network 404 may include a 3G cellular connection, a universal mobile telecommunications system (UMTS) connection, a high-speed packet access (HSPA) connection, a 4G/LTE connection, an RF connection, a Wi-Fi connection, a Bluetooth connection, another wireless communication interface, combinations thereof, or other appropriate connection now existing or hereafter developed. In some embodiments, the remote server 402 may further couple to a geographic information system (GIS) server 416, which provides maps for the GPS locations associated with data received from the AHED unit. In one example, a single instance of the middleware 410, the database 412, the web server 414, and the GIS server 416 may support up to 10,000 AHED units, and thus up to 10,000 tractor-trailer vehicles 160. Thus, instances of one or more of these components may be scaled up as needed in order to meet various performance and/or economic goals.

In addition to the various features described above, the systems 400, 450 may be configured to provide real-time location and mapping of tractor-trailer vehicles 160 (including a tractor unit or trailer), an ability to assign tags to any particular tractor unit or trailer (e.g., to provide a trailer type, trailer number, group/region/fleet information, owner information, or contact information), an ability to provide on-demand and/or schedulable reports, among other features. By way of example, such reports may include a percentage time a trailer is loaded vs. empty, moving vs. stationary, and/or attached vs. standalone. Exemplary reports may further provide an approximate trailer weight, fuel savings information, shock/vibration information, braking information, adverse swaying (e.g., jack-knifing) information, lost traction/wheel-slip information, battery levels, and/or APU usage information. The systems 400, 450 also provide for the configuration of alerts (e.g., to alert a driver, fleet manager, or other user) for a variety of conditions such as aggressive braking, excessive shock, excessive idling, APU power low, overheating, unit damage, and/or battery or device failure. In some embodiments, the systems 400, 450 may further include an ability to set and/or otherwise define 'Operation Hours' for a given trailer and/or tractor unit, and alerts may be set for operation activity occurring outside the defined 'Operation Hours'. In some cases, the systems 400, 450 may also monitor driver behaviors (e.g., driving patterns), real-time traffic data, weather information, road conditions, and/or other such factors that may be used to determine a desired stopover location, an optimal navigation route to the stopover location, and/or an estimated time of arrival (ETA) at the stopover location. For example, in some embodiments, one or more of the above features may be implemented in part using a vehicle navigation system (e.g., such as a GPS navigation system) on the tractor-trailer vehicles 160, where the navigation system incorporates the traffic data, weather information, road conditions, etc. to determine the route and ETA to the stopover location. While some examples of various features provided by the systems 400, 450 have been provided, those skilled in the art in possession of the present disclosure will recognize other features that may be implemented, while remaining within the scope of the present disclosure.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

What is claimed is:

1. A method for managing a state of charge (SoC) of an energy store of a vehicle comprising:
   storing a machine-readable encoding of a dynamic weight value that specifies a usage of a fuel-fed engine relative to a usage of the energy store, wherein the fuel-fed engine powers a drivetrain that provides primary motive forces to the vehicle, wherein the energy store is configured to supply electrical power to an electrically powered drive axle that provides supplemental torque to one or more wheels of the vehicle in a first mode of operation, and wherein the energy store is configured to receive energy recovered using the electrically powered drive axle in a second mode of operation;
   computationally determining an estimated travel time to a stopover location based in part on a distance between a current GPS location of the vehicle and the stopover location;
   using the estimated travel time, modifying the dynamic weight value to provide an updated dynamic weight value; and
   responsive to providing the updated dynamic weight value, increasing the SoC of the energy store while the vehicle travels over a roadway to provide a target SoC of the energy store when the vehicle arrives at the stopover location.

2. The method of claim 1, further comprising:
   while at the stopover location and without idling of the fuel-fed engine, operating an auxiliary power unit (APU) on the vehicle, the auxiliary power unit coupled to receive electrical power from the energy store.

3. The method of claim 2, further comprising:
   electrically powering one or more devices or systems on the vehicle with the APU at the stopover location.

4. The method of claim 1,
   wherein the computationally determining the estimated travel time further includes computationally determining at least one of (i) a first estimated travel time to a mandatory rest period, (ii) a second estimated travel time to a prior stopover location, and (iii) a third estimated travel time to a designated stopover location pre-assigned by a fleet manager or a vehicle operator.

5. The method of claim 1, further comprising:
   before computationally determining the estimated travel time to the stopover location, determining that the stopover location is along a projected route of the vehicle.

6. The method of claim 1, further comprising:
   computationally determining the target SoC of the energy store for operating the vehicle in an APU mode;
   computationally determining a difference between the target SoC and a current SoC of the energy store;
   computationally determining a time to charge the energy store to the target SoC; and
   managing charging of the energy store over the computationally determined time.

7. The method of claim 1, further comprising:
   managing the SOC of the energy store by controllably managing a dynamic weight value that specifies usage of a fuel-fed engine of the vehicle relative to usage of the energy store.

8. The method of claim 1,
   wherein the vehicle includes a towed vehicle, a towing vehicle, or a combination thereof.

9. A vehicle comprising a control system storing one or more sequences of instructions for managing a state of charge (SoC) of an energy store of the vehicle, which, when executed using one or more processors, cause the one or more processors to execute:
   storing a machine-readable encoding of a dynamic weight value that specifies a usage of a fuel-fed engine relative to a usage of the energy store, wherein the fuel-fed engine powers a drivetrain that provides primary motive forces to the vehicle, wherein the energy store is configured to supply electrical power to an electrically powered drive axle that provides supplemental torque to one or more wheels of the vehicle in a first mode of operation, and wherein the energy store is configured to receive energy recovered using the electrically powered drive axle in a second mode of operation;

computationally determining an estimated travel time to a stopover location based in part on a distance between a current GPS location of the vehicle and the stopover location;

use the estimated travel time, modifying the dynamic weight value to provide an updated dynamic weight value; and responsive to providing the updated dynamic weight value, increasing the SoC of the energy store while the vehicle travels over a roadway to provide a target SoC of the energy store when the vehicle arrives at the stopover location.

10. The vehicle of claim 9, wherein the one or more sequences of instructions which, when executed using the one or more processors, further cause the one or more processors to execute:

while at the stopover location and without idling of the fuel-fed engine, operating an auxiliary power unit (APU) on the vehicle, the auxiliary power unit coupled to receive electrical power from the energy store.

11. The vehicle of claim 10, wherein the one or more sequences of instructions which, when executed using the one or more processors, further cause the one or more processors to execute:

electrically powering one or more devices or systems on the vehicle with the APU at the stopover location.

12. The vehicle of claim 9, wherein the one or more sequences of instructions which, when executed using the one or more processors, further cause the one or more processors to execute:

wherein the computationally determining the estimated travel time further includes computationally determining at least one of (i) a first estimated travel time to a mandatory rest period, (ii) a second estimated travel time to a prior stopover location, and (iii) a third estimated travel time to a designated stopover location pre-assigned by a fleet manager or a vehicle operator.

13. The vehicle of claim 9, wherein the one or more sequences of instructions which, when executed using the one or more processors, further cause the one or more processors to execute:

before computationally determining the estimated travel time to the stopover location, determining that the stopover location is along a projected route of the vehicle.

14. The vehicle of claim 9, wherein the one or more sequences of instructions which, when executed using the one or more processors, further cause the one or more processors to execute:

computationally determining the target SoC of the energy store for operating the vehicle in an APU mode;

computationally determining a difference between the target SoC and a current SoC of the energy store;

computationally determining a time to charge the energy store to the target SoC; and managing charging of the energy store over the computationally determined time.

15. The vehicle of claim 9, wherein the one or more sequences of instructions which, when executed using the one or more processors, further cause the one or more processors to execute:

managing the SOC of the energy store by controllably managing a dynamic weight value that specifies usage of a fuel-fed engine of the vehicle relative to usage of the energy store.

16. The vehicle of claim 9, wherein the vehicle includes a towed vehicle, a towing vehicle, or a combination thereof.

* * * * *